United States Patent
Sato et al.

(10) Patent No.: US 10,797,186 B2
(45) Date of Patent: Oct. 6, 2020

(54) SOLAR CELL, SOLAR CELL MODULE, AND SOLAR CELL MANUFACTURING METHOD IN WHICH WIRING MEMBER IS CONNECTED TO SURFACE

(71) Applicant: Panasonic Intellectual Property Management Co., Ltd., Osaka (JP)

(72) Inventors: Shoji Sato, Osaka (JP); Mikio Taguchi, Osaka (JP); Satoru Shimada, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 85 days.

(21) Appl. No.: 16/146,607

(22) Filed: Sep. 28, 2018

(65) Prior Publication Data
US 2019/0035952 A1   Jan. 31, 2019

Related U.S. Application Data

(63) Continuation of application No. PCT/JP2016/004425, filed on Sep. 30, 2016.

(30) Foreign Application Priority Data

Mar. 30, 2016 (JP) ................................ 2016-069263

(51) Int. Cl.
   *H01L 31/0224* (2006.01)
   *H01L 31/05* (2014.01)
   (Continued)

(52) U.S. Cl.
   CPC ........... *H01L 31/022433* (2013.01); *H01L 31/02008* (2013.01); *H01L 31/05* (2013.01); *H01L 31/0504* (2013.01); *H01L 31/18* (2013.01)

(58) Field of Classification Search
   CPC ............................................. H01L 31/022433
   See application file for complete search history.

(56) References Cited

U.S. PATENT DOCUMENTS

| 7,355,114 | B2 * | 4/2008 | Ojima ............. H01L 31/022433 136/243 |
| 9,321,076 | B2 | 4/2016 | Mantani et al. |

(Continued)

FOREIGN PATENT DOCUMENTS

| JP | 9-169103 A | 6/1997 |
| JP | 2000-294819 A | 10/2000 |

(Continued)

OTHER PUBLICATIONS

International Search Report issued in corresponding International Patent Application No. PCT/JP2016/004425, dated Dec. 13, 2016, with English Translation.

*Primary Examiner* — Edward J. Schmiedel
(74) *Attorney, Agent, or Firm* — McDermott Will & Emery LLP

(57) ABSTRACT

A plurality of finger electrodes are disposed on a surface of a photoelectric conversion layer 60 and extend in a first direction. The plurality of finger electrodes are arranged in a second direction in which an inter-cell wiring member adapted to be disposed on the surface of the photoelectric conversion layer extends. A height of each of those of the plurality of finger electrodes disposed toward ends in the second direction from a part of the photoelectric conversion layer where the inter-cell wiring member is adapted to be disposed is larger than a height of the finger electrode disposed at a center in the second direction from the part of the photoelectric conversion layer where the inter-cell wiring member is adapted to be disposed.

8 Claims, 12 Drawing Sheets

(51) Int. Cl.
    *H01L 31/02*     (2006.01)
    *H01L 31/18*     (2006.01)

(56) References Cited

U.S. PATENT DOCUMENTS

| | | | |
|---|---|---|---|
| 2012/0037227 A1* | 2/2012 | Takahama | H01L 31/022433 136/258 |
| 2012/0255592 A1* | 10/2012 | Chang | H01L 31/022433 136/244 |
| 2013/0306129 A1* | 11/2013 | Tohoda | H01L 31/022433 136/244 |
| 2014/0182675 A1* | 7/2014 | Tokuoka | H01L 31/022433 136/256 |
| 2014/0196783 A1* | 7/2014 | Tohoda | H01L 31/0547 136/256 |
| 2015/0068596 A1 | 3/2015 | Ibara et al. | |
| 2015/0216058 A1 | 7/2015 | Mantani et al. | |
| 2016/0322513 A1* | 11/2016 | Martin | H01L 31/0201 |

FOREIGN PATENT DOCUMENTS

| | | |
|---|---|---|
| JP | 2008-263163 A | 10/2008 |
| JP | 2010-118706 A | 5/2010 |
| WO | 2014/040834 A2 | 3/2014 |

\* cited by examiner

SOLAR CELL, SOLAR CELL MODULE, AND SOLAR CELL MANUFACTURING METHOD IN WHICH WIRING MEMBER IS CONNECTED TO SURFACE

CROSS-REFERENCE TO RELATED APPLICATION

This application is a U.S. continuation application of PCT International Patent Application Number PCT/JP2016/004425, filed Sep. 30, 2016, claiming the benefit of priority of Japanese Patent Application Number 2016-069263, filed Mar. 30, 2016, the entire contents of which are hereby incorporated by reference.

BACKGROUND

1. Field

The disclosure relates to solar cells and, more particularly, to a solar cell, solar cell module and solar cell manufacturing method in which a wiring member is connected on the surface.

2. Description of the Related Art

In a solar cell module of JP2010-118076, a plurality of solar cells are arranged on a plane and flush with each other. An electrode is formed on the surface of each solar cell. The electrodes of two adjacent solar cells are electrically connected via a wiring member.

Further, the solar cell and the wiring member are encapsulated by a filler between a front surface member and a back surface member.

Generally, silicon is used in solar cells and a metal such as silver and copper is used for the wiring member. Silicon and metal differ in the coefficient of thermal expansion. The coefficient of thermal expansion of silicon is smaller than the coefficient of thermal expansion of metal so that silicon is less likely to expand or contract than metal. When the filler expands or contracts due to the impact from heat, the metal wiring member expands or contracts in association. However, the silicon solar cell does not expand or contract as much as the wiring member and so undergoes a stress by being pulled by the wiring member. To improve the durability of the solar cell, it is preferable to reduce the stress exerted on the solar cell.

SUMMARY

In this background, a purpose of the disclosure is to provide a technology for reducing the stress exerted on the solar cell.

A solar cell according to an aspect of the present disclosure includes: a photoelectric conversion layer; and a plurality of collecting electrodes disposed on a surface of the photoelectric conversion layer and extending in a first direction. The plurality of collecting electrodes are arranged in a second direction in which a wiring member adapted to be disposed on the surface of the photoelectric conversion layer extends, the second direction intersecting the first direction, and a height of each of those of the plurality of collecting electrodes disposed toward ends in the second direction from a part of the photoelectric conversion layer where the wiring member is adapted to be disposed is larger than a height of the collecting electrode disposed at a center in the second direction from the part of the photoelectric conversion layer where the wiring member is adapted to be disposed.

Another embodiment of the present disclosure relates to a solar cell module. The solar cell module includes: a plurality of solar cells; and a wiring member that connects adjacent solar cells electrically, wherein each of the solar cells includes: a photoelectric conversion layer; and a plurality of collecting electrodes disposed on a surface of the photoelectric conversion layer and extending in a first direction. The plurality of collecting electrodes are arranged in a second direction in which the wiring member disposed on the surface of the photoelectric conversion layer extends, the second direction intersecting the first direction, and a height of each of those of the plurality of collecting electrodes disposed toward ends in the second direction from a part of the photoelectric conversion layer where the wiring member is disposed is larger than a height of the collecting electrode disposed at a center in the second direction from the part of the photoelectric conversion layer where the wiring member is disposed.

Still another embodiment of the present disclosure relates to a method of manufacturing a solar cell. The method includes: preparing a photoelectric conversion layer; and forming a plurality of collecting electrodes extending in a first direction on a surface of the photoelectric conversion layer. The plurality of collecting electrodes are arranged in a second direction in which a wiring member adapted to be disposed on the surface of the photoelectric conversion layer extends, the second direction intersecting the first direction, and a height of each of those of the plurality of the collecting electrodes disposed toward ends in the second direction from a part of the photoelectric conversion layer where the wiring member is adapted to be disposed is larger than a height of the collecting electrode disposed at a center in the second direction from the part of the photoelectric conversion layer where the wiring member is adapted to be disposed.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

The invention will now be described by reference to the preferred embodiments. This does not intend to limit the scope of the present invention, but to exemplify the invention.

Embodiment 1

A brief summary will be given before describing the disclosure in specific details. Embodiment 1 relates to a solar cell module in which a plurality of solar cells are arranged. A bus bar electrode is arranged on the surface of each solar cell. A wiring member is bonded to the bus bar electrode via a conductive film adhesive. The bonding electrically connects the bus bar electrode and the wiring member. A wiring member is also bonded to a solar cell adjacent to the solar cell so that the two adjacent solar cells are electrically connected. The solar cell and the wiring member are encapsulated by an encapsulating member disposed between two protective members. As mentioned above, silicon is used in the solar cells and a metal such as silver and copper is used for the wiring member. Therefore, the solar cell is less likely to expand or contract than the wiring member. Further, a resin seat is used for the encapsulating member.

The encapsulating member expands or contracts due to the impact from temperature variation occurring when the solar cell module is used outdoors. In association with the expansion and contraction of the encapsulating member, the wiring member also expands or contracts. However, the solar cell does not expand or contract as much as the wiring member and so undergoes a stress by being pulled by the wiring member. A weak connection between the solar cell and the wiring member is useful to reduce the stress that the solar cell undergoes. This is achieved by, for example, reducing the area of contact between the bus bar electrode and the wiring member. However, a smaller area of contact results in larger electrical resistance and lower conductivity. It is required to reduce the stress exerted on the solar cell while also inhibiting the conductivity from being lowered.

The magnitude of the stress that the solar cell undergoes is not uniform in the solar cell and varies depending on the portion of the solar cell. To describe it more specifically, the bus bar electrode and the wiring member disposed on the surface of the solar cell are shaped to extend in one direction. The stress is larger toward the end of the solar cell in that one direction than at the center. This embodiment involves weakening the connection between the solar cell and the wiring member where the stress is larger but not weakening the connection between the solar cell and the wiring member elsewhere. The terms "parallel" and "orthogonal" in the following description not only encompass completely parallel or orthogonal but also encompass slightly off-parallel within the margin of error. The term "substantially" means identical within the margin of error.

Figure 1:
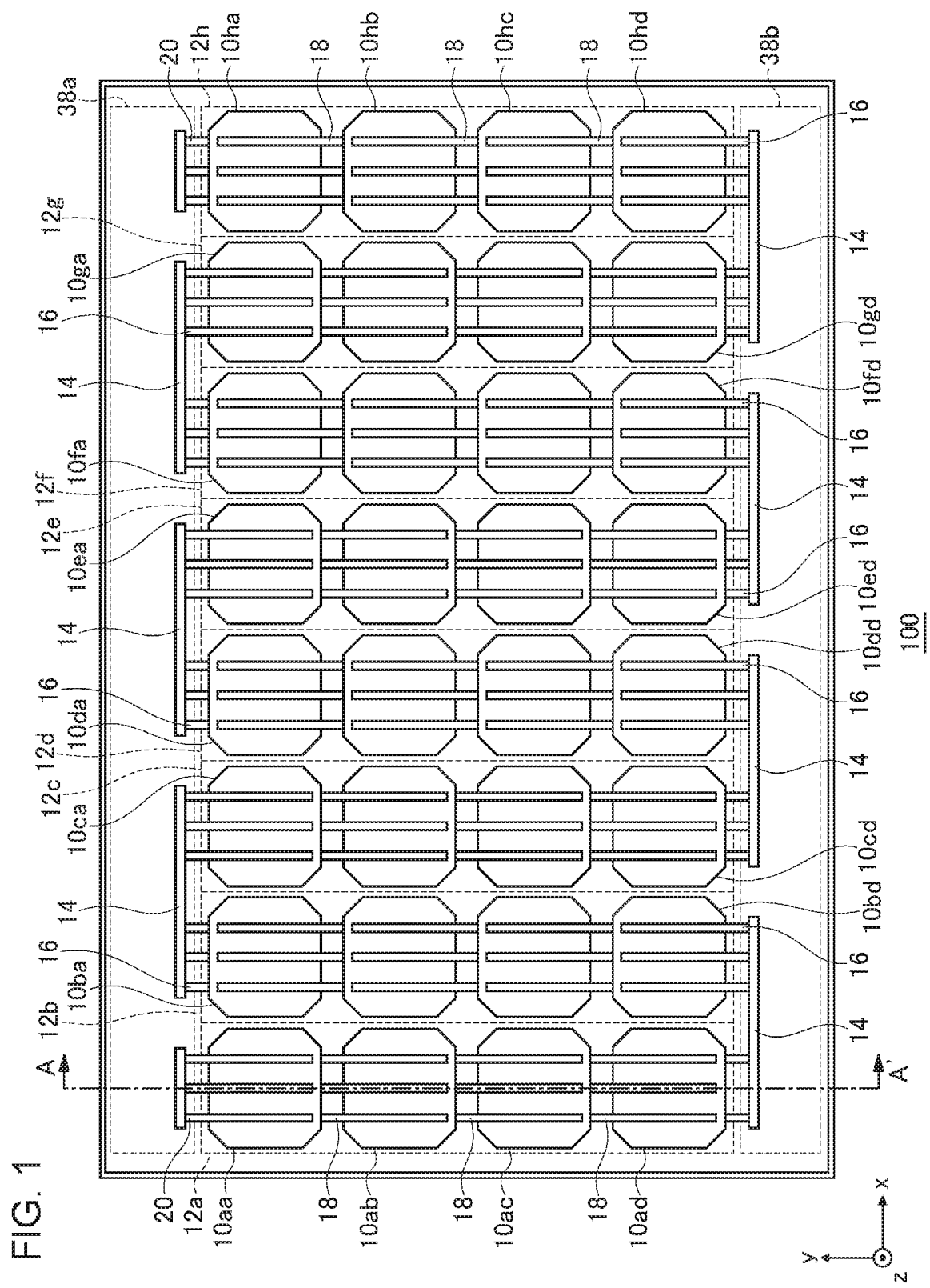
FIG. 1 is a plan view of the feature of a solar cell module according to embodiment 1.
Figure 2:
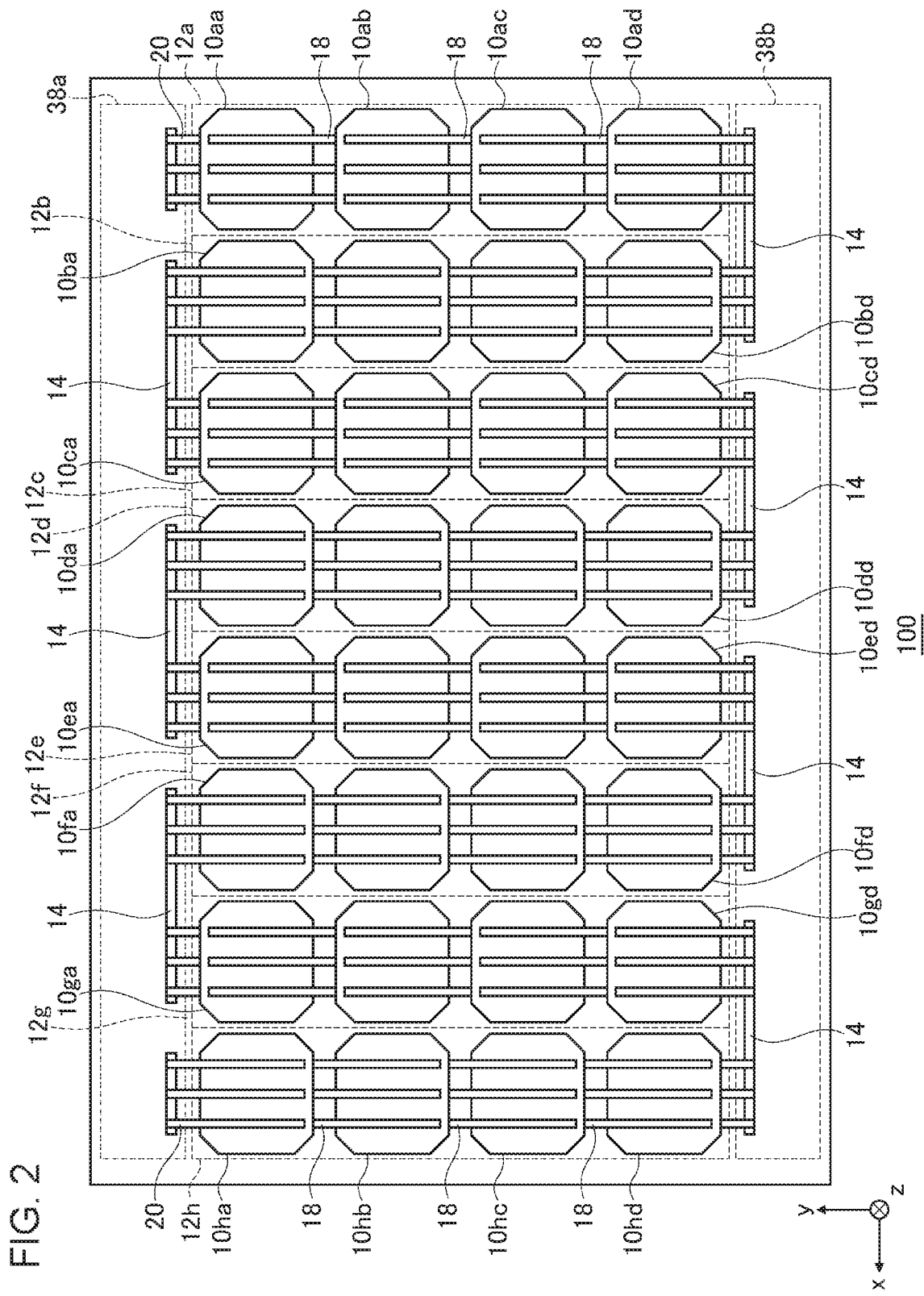
FIG. 2 is a plan view of the solar cell module of FIG. 1 as viewed from a back surface side.

FIG. 1 is a plan view of the feature of a solar cell module 100 as viewed from a light receiving surface side. FIG. 2 is a plan view of the solar cell module 100 as viewed from a back surface side. As shown in FIG. 1, an orthogonal coordinate system including an x axis, y axis, and a z axis is defined. The x axis and y axis are orthogonal to each other in the plane of the solar cell module 100. The z axis is perpendicular to the x axis and y axis and extends in the direction of thickness of the solar cell module 100. The positive directions of the x axis, y axis, and z axis are defined in the directions of arrows in FIG. 1 and the negative directions are defined in the directions opposite to those of the arrows. Of the two principal surfaces forming the solar cell module 100 that are parallel to the x-y plane, the principal surface disposed on the positive direction side along the z axis is the light receiving surface, and the principal surface disposed on the negative direction side along the z axis is the back surface. Hereinafter, the positive direction side along the z axis will be referred to as "light receiving surface side" and the negative direction side along the z axis will be referred to as "back surface side".

The solar cell module 100 includes an 11th solar cell 10aa, . . . , an 84th solar cell 10hd, which are generically referred to as solar cells 10, an inter-group wiring member 14, a group-end wiring member 16, an inter-cell wiring member 18, and a terminal wiring member 20. A first non-generating area 38a and a second non-generating area 38b are disposed to sandwich a plurality of solar cells 10 in the y axis direction. More specifically, the first non-generating area 38a is disposed farther on the positive direction side along the y axis than the plurality of solar cells 10, and the second non-generating area 38b is disposed further on the negative direction side along the y axis than the plurality of solar cells 10. The first non-generating area 38a and the second non-generating area 38b (hereinafter, sometimes generically referred to as "non-generating areas 38") have a rectangular shape and do not include the solar cells 10.

Each of the plurality of solar cells 10 absorbs incident light and generates photovoltaic power. The solar cell 10 is formed of, for example, a semiconductor material such as crystalline silicon, gallium arsenide (GaAs), or indium phosphorus (InP). The structure of the solar cell 10 is not limited to any particular type. It is assumed that crystalline silicon and amorphous silicon are stacked by way of example.

Figure 3A:
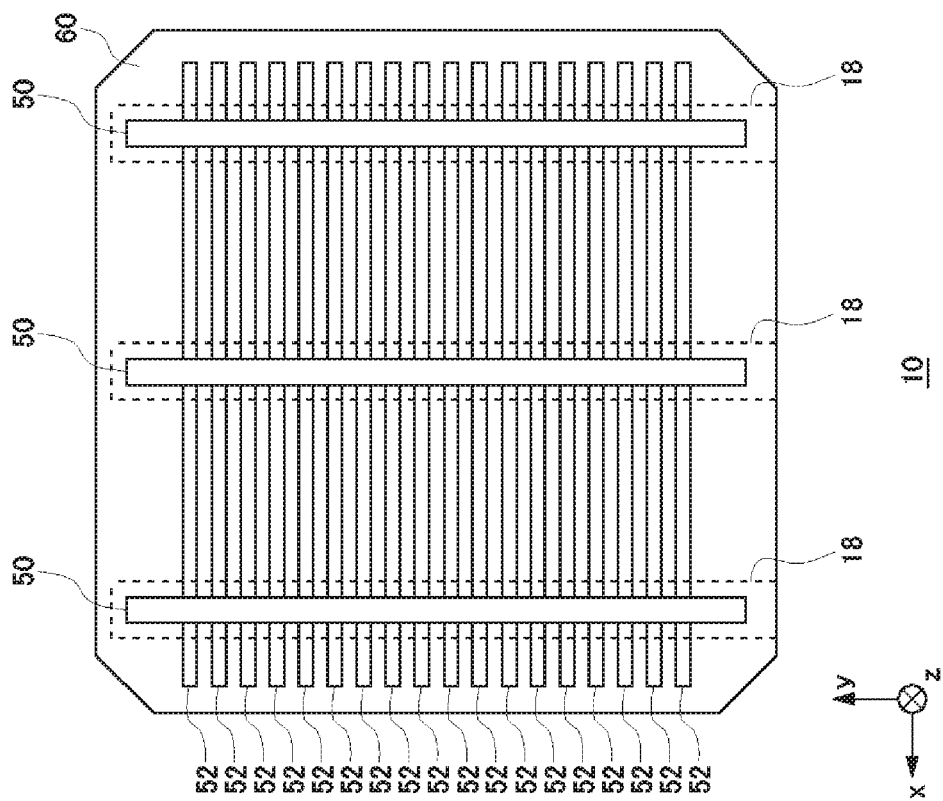
FIGS. 3A-3B are plan views showing the feature of the solar cell of FIG. 1.
Figure 3B:
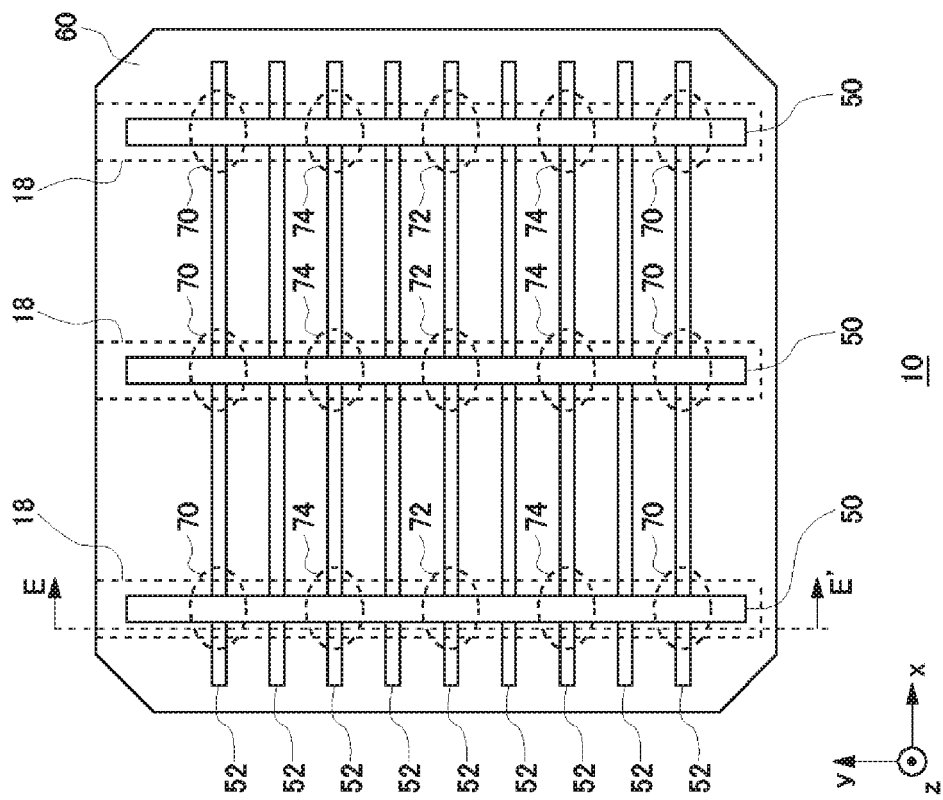

FIGS. 3A-3B are plan views showing the feature of the solar cell 10. FIG. 3A shows the light receiving surface of the solar cell 10 and FIG. 3B shows the back surface of the solar cell 10. A photoelectric conversion layer 60 corresponds to the semiconductor material mentioned above. The light receiving surface and the back surface of the photoelectric conversion layer 60 are formed in the shape of an octagon in which the longer side and the shorter side are alternately joined. The surfaces may be formed in other shapes. For example, the shorter side included in the octagon may be non-linear, or the surfaces may be shaped like a rectangle. As shown in FIG. 3A, a plurality of finger electrodes 52 extending in the x axis direction in a mutually parallel manner are disposed on the light receiving surface of the photoelectric conversion layer 60. The number of finger electrodes 52 is not limited to "9".

Further, a plurality of (e.g., 3) bus bar electrodes 50 are disposed to intersect (e.g., be orthogonal to) the plurality of finger electrodes 52 on the light receiving surface of the photoelectric conversion layer 60. The bus bar electrode 50 connects the plurality of finger electrodes 52 to each other. The bus bar electrode 50 and the finger electrode 52 are formed of, for example, silver paste or the like. The inter-cell wiring member 18 is disposed and layered upon each of the plurality of bus bar electrodes 50 from the positive direction side along the z axis. The bus bar electrode 50 and the inter-cell wiring member 18 are bonded by a conductive film adhesive. The inter-cell wiring member 18 is formed of a metal such as silver and copper and extends in the direction of adjacent solar cells 10, i.e., in the y axis direction. It can therefore be said that the bus bar electrode 50 is disposed between the light receiving surface of the photoelectric conversion layer 60 and the inter-cell wiring member 18.

As shown in FIG. 3B, the bus bar electrode 50, the finger electrode 52, and the inter-cell wiring member 18 are disposed on the back surface of the photoelectric conversion layer 60 as in the light receiving surface of the photoelectric conversion layer 60. The number of bus bar electrodes 50 and inter-cell wiring members 18 are the same in the light receiving surface and in the back surface of the photoelectric conversion layer 60. However, the number of finger electrodes 52 is larger on the back surface than on the light receiving surface of the photoelectric conversion layer 60. Provided that the x axis direction corresponds to the "first direction", the y axis direction corresponds to the "second direction". Provided that the finger electrode 52 is referred to as a "collecting electrode", the bus bar electrode 50 is referred to as "a further collecting electrode". Referring to FIGS. 3A-3B, the feature of a portion of connection between the bus bar electrode 50, the finger electrode 52, and the inter-cell wiring member 18 will be described later in detail, and reference is made back to FIGS. 1 and 2.

The plurality of solar cells 10 are arranged in a matrix on the x-y plane. By way of example, eight solar cells 10 are arranged in the x axis direction and 4 solar cells are arranged in the y axis direction. The number of solar cells 10 arranged in the x axis direction and the number of solar cells 10 arranged in the y axis direction are not limited to the examples above. The 4 solar cells 10 arranged and disposed in the y axis direction are connected in series by the inter-cell wiring member 18 so as to form one solar cell group 12. For example, by connecting the 11th solar cell 10*aa*, a 12th solar cell 10*ab*, a 13th solar cell 10*ac*, and a 14th solar cell 10*ad*, a 1st solar cell group 12*a* is formed. The other solar cell groups 12 (e.g., a 2nd solar cell group 12*b* through an 8th solar cell group 12*h*) are similarly formed. As a result, eight solar cell groups 12 are arranged in parallel in the x axis direction. The solar cell groups 12 correspond to a string.

In order to form the solar cell groups 12, the inter-cell wiring members 18 connect the bus bar electrode 50 on the light receiving surface side of one of adjacent solar cells 10 to the bus bar electrode 50 on the back surface side of the other solar cell 10. For example, the three inter-cell wiring members 18 for connecting the 11th solar cell 10*aa* and the 12th solar cell 10*ab* electrically connect the bus bar electrode 50 on the back surface side of the 11th solar cell 10*aa* and the bus bar electrode 50 on the light receiving surface side of the 12th solar cell 10*ab*. As shown in FIGS. 3A-3B, the inter-cell wiring members 18 are disposed and layered on the respective bus bar electrodes 50.

Three of the seven inter-group wiring members 14 are disposed in the first non-generating area 38*a* and the remaining four are disposed in the second non-generating area 38*b*. Each of the seven inter-group wiring members 14 extends in the x axis direction and is electrically connected to mutually adjacent two solar cell groups 12 via the group-end wiring members 16. For example, the 14th solar cell 10*ad* located on the side of the second non-generating area 38*b* of the 1st solar cell group 12*a* and a 24th solar cell 10*bd* located on the side of the second non-generating area 38*b* of the 2nd solar cell group 12*b* are each connected electrically to the inter-group wiring member 14 via the group-end wiring members 16. The group-end wiring members 16 are arranged in a manner similar to that of the inter-cell wiring members 18 on the light receiving surface or the back surface of the solar cell 10.

The terminal wiring member 20 is connected to the 1st solar cell group 12*a* and the 8th solar cell group 12*h* located on the respective ends in the x axis direction. The terminal wiring member 20 connected to the 1st solar cell group 12*a* extends from the light receiving surface side of the 11th solar cell 10*aa* in the direction of the first non-generating area 38*a*. A pair of positive and negative lead wirings (not shown) are connected to the terminal wiring member 20.

Figure 4:
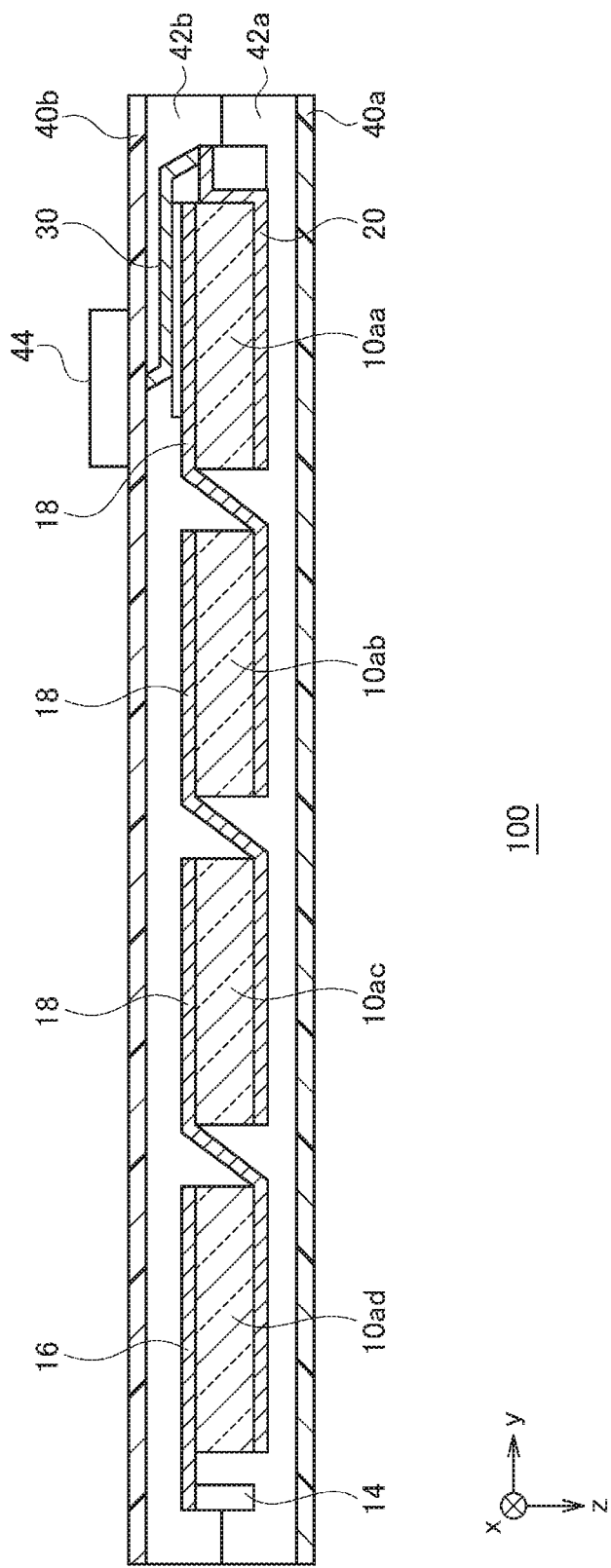
FIG. 4 is a cross sectional view of the solar cell module of FIG. 1 along the y axis.

FIG. 4 is a cross sectional view of the solar cell module 100 along the y axis. FIG. 4 shows an A-A' section of FIG. 1. The solar cell module 100 includes the 11th solar cell 10*aa*, the 12th solar cell 10*ab*, the 13th solar cell 10*ac*, the 14th solar cell 10*ad*, which are generically referred to as solar cells 10, the inter-group wiring member 14, the group-end wiring member 16, the inter-cell wiring member 18, the terminal wiring member 20, a lead wiring 30, a first protective member 40*a*, a second protective member 40*b*, which are generically referred to as protective members 40, a first encapsulating member 42*a*, a second encapsulating member 42*b*, which are generically referred to as encapsulating members 42, and a terminal box 44. The top of FIG. 4 corresponds to the back surface and the bottom corresponds to the light receiving surface.

The first protective member 40*a* is disposed on the light receiving surface side of the solar cell module 100 and protects the surface of the solar cell module 100. The first protective member 40*a* is formed by using a translucent and water shielding glass, translucent plastic, etc. and is formed in a rectangular shape. The first encapsulating member 42*a* is stacked on the back surface of the first protective member 40*a*. The first encapsulating member 42*a* is disposed between the first protective member 40*a* and the solar cell 10 and adhesively bonds the first protective member 40*a* and the solar cell 10. For example, a thermoplastic resin sheet of polyolefin, EVA, polyvinyl butyral (PVB), polyimide, or the like may be used as the first encapsulating member 42*a*. A thermosetting resin may alternatively be used. The first encapsulating member 42*a* is formed by a translucent, rectangular sheet member having a surface of substantially the same dimension as the x-y plane in the first protective member 40*a*.

The second encapsulating member 42*b* is stacked on the back surface of the first encapsulating member 42*a*. The second encapsulating member 42*b* encapsulates the plurality of solar cells 10, the inter-cell wiring members 18, etc. between the second encapsulating member 42*b* and the first encapsulating member 42*a*. The second encapsulating member 42*b* may be formed of a material similar to that of the first encapsulating member 42*a*. Alternatively, the second encapsulating member 42*b* may be integrated with the first encapsulating member 42*a* by heating the members in a laminate cure process.

The second protective member 40*b* is stacked on the back surface side of the second encapsulating member 42*b*. The second protective member 40*b* protects the back surface side of the solar cell module 100 as a back sheet. A resin film of, for example, polyethylene terephthalate (PET), a stack film having a structure in which an Al foil is sandwiched by resin films, or the like is used as the second protective member 40*b*. An opening (not shown) extending through in the z axis direction is provided in the second protective member 40*b*.

The terminal box 44 is formed in a cuboid shape and is adhesively bonded to the second protective member 40*b* from the back surface side of the second protective member 40*b* by using an adhesive like silicone so as to cover the opening (not shown) of the second protective member 40*b*. The lead wiring 30 is led to a bypass diode (not shown)

stored in the terminal box 44. The terminal box 44 is disposed on the second protective member 40b at, for example, a position overlapping a 41st solar cell 10da and a 51st solar cell 10ea. An Al frame may be attached around the solar cell module 100.

The feature of a portion of connection between the bus bar electrode 50, the finger electrode 52, and the inter-cell wiring member 18 will be described below in further detail, based on the feature of the solar cell module 100 described above. For clarity of the description, the portions of connection between the bus bar electrode 50, the finger electrode 52, and the inter-cell wiring member 18 are grouped into a plurality of categories. As shown in FIG. 3A, the categories include a first area 70, a second area 72, and a third area 74. The first area 70 is an area surrounding a portion of each of those of the plurality of finger electrodes 52 disposed toward the end in the y axis direction, where the inter-cell wiring member 18 is disposed. For example, three first areas 70 are provided around the finger electrode 52 disposed at the extremity in the positive direction along the y axis, and three first areas 70 are provided around the finger electrode 52 disposed at the extremity in the negative direction along the x axis.

The second area 72 is an area surrounding a portion of one of the plurality of finger electrodes 52 disposed at the center in the y axis direction, where the inter-cell wiring member 18 is disposed. For example, three second areas 72 are provided around the finger electrode 52 disposed at the center in the y axis direction. The third area 74 is an area surrounding a portion of each of those of the plurality of finger electrodes 52 between the finger electrode 52 for which the first area 70 is provided and the finger electrode 52 for which the second area 72 is provided, where the inter-cell wiring member 18 is disposed. For example, three third areas 74 are provided around the finger electrode 52 on the positive direction side along the y axis, and three third areas 74 are provided around the finger electrode 52 on the negative direction side along the y axis.

Figure 5A:
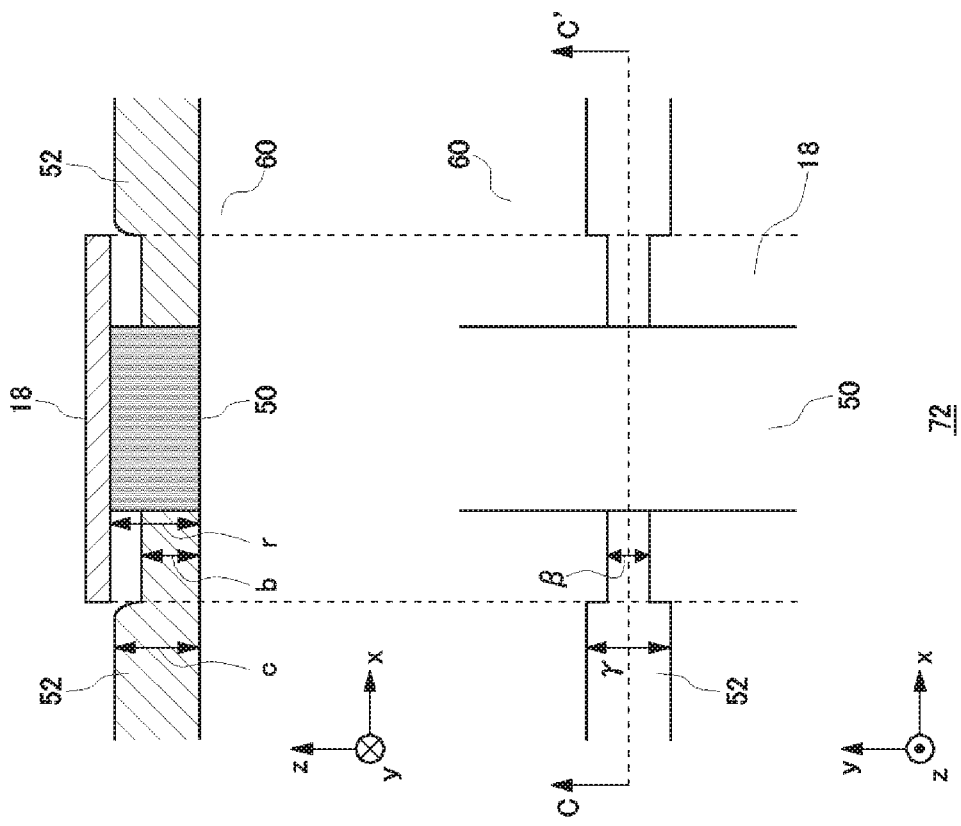
FIGS. 5A-5B show the detail of a portion of the solar cell of FIG. 3A.
Figure 5B:
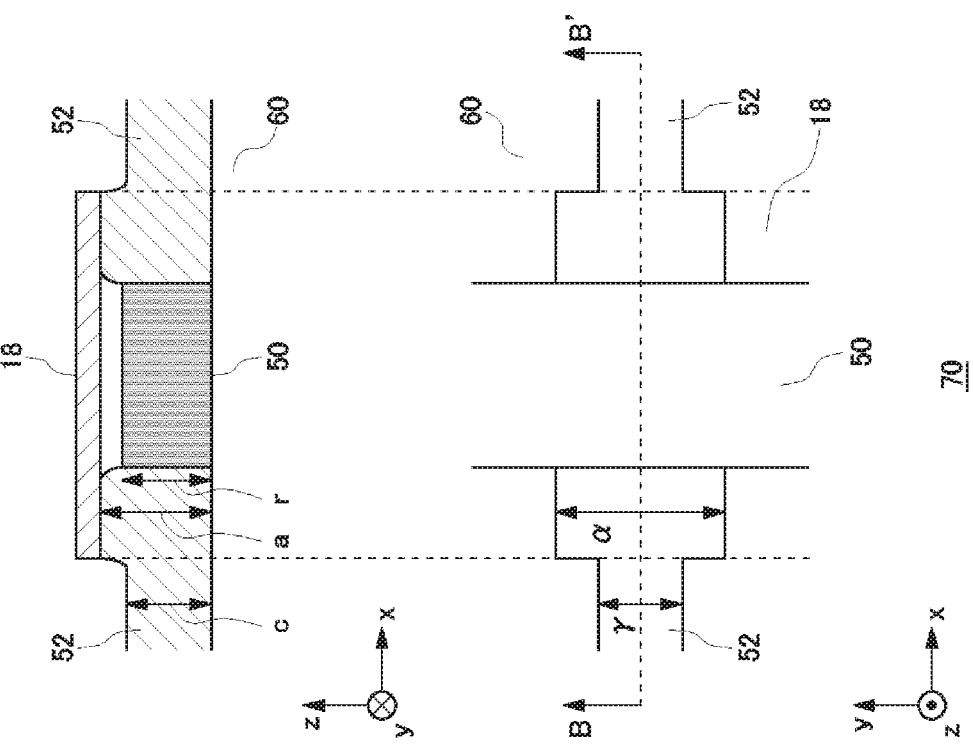

FIGS. 5A-5B show the detail a portion of the solar cell 10. An enlarged plan view of the first area 70 of FIG. 3A is shown at the bottom of FIG. 5A. As described above, the finger electrode 52 extending in the x axis direction and the bus bar electrode 50 extending in the y axis direction intersect where the inter-cell wiring member 18 is disposed. In this embodiment, the width of the inter-cell wiring member 18 is configured to be larger than the width of the bus bar electrode 50. The width of the inter-cell wiring member 18 is, for example, about 1 mm-3 mm, and the width of the bus bar electrode is, for example, about 1 mm or smaller. The width of the finger electrode 52 in the y axis direction is "γ" where the inter-cell wiring member 18 is not disposed, and the width of the finger electrode 52 in the y axis direction is "α" where the inter-cell wiring member 18 is disposed, where $\alpha > \gamma$. In other words, the width of the finger electrode 52 in the first area 70 defined where the inter-cell wiring member 18 is disposed is configured to be larger than the width defined where the inter-cell wiring member 18 is not disposed.

A B-B' section in the plan view shown at the bottom is shown at the top of FIG. 5A. The bus bar electrode 50 and the finger electrode 52 are disposed on the positive direction side of the photoelectric conversion layer 60 along the z axis. The height of the finger electrode 52 in the z axis direction defined where the inter-cell wiring member 18 is not disposed is "c", and the height of the finger electrode 52 in the z axis direction defined where the inter-cell wiring member 18 is disposed is "a", where $a > c$. In other words, the height of the finger electrode 52 in the first area 70 from the part of the photoelectric conversion layer 60 defined where the inter-cell wiring member 18 is disposed is larger than the height from the part of the photoelectric conversion layer 60 defined where the inter-cell wiring member is not disposed.

Further, the height of the bus bar electrode 50 in the z axis direction is "r", where $a > r$. In other words, the height of the finger electrode 52 in the first area 70 from the part of the photoelectric conversion layer 60 defined where the inter-cell wiring member 18 is disposed is larger than the height of the bus bar electrode 50 from the part of the photoelectric conversion layer 60. According to the feature, the inter-cell wiring member 18 is primarily connected to the positive direction side of the finger electrode 52 along the z axis. As described above, a conductive film adhesive is used for this connection, and the conductive film adhesive is a polymer resin containing an acrylic polymer and a thermosetting resin. Further, the conductive film adhesive contains conductive particles and has anisotropical conductivity.

Therefore, the area of contact between the bus bar electrode 50 and the inter-cell wiring member is reduced with the result that the connection between the bus bar electrode 50 and the inter-cell wiring member 18 is weakened. On the other hand, the finger electrode 52 and the inter-cell wiring member 18 are connected so that the electrical resistance is inhibited from being increased and the conductivity is inhibited from being lowered. It should be noted that the bus bar electrode 50 and the finger electrode 52 are formed by screen printing on the light receiving surface of the photoelectric conversion layer 60. In the case where the finger electrode 52 is formed by screen printing, the larger the width of the finger electrode 52, the larger the height of the finger electrode 52. The same holds true of the bus bar electrode 50. The bus bar electrode 50 and the finger electrode 52 are shown as separate features but may be formed to be integrated with each other.

An enlarged plan view of the second area 72 of FIG. 3A is shown at the bottom of FIG. 5B. As described above, the finger electrode 52 extending in the x axis direction and the bus bar electrode 50 extending in the y axis direction intersect where the inter-cell wiring member 18 is disposed. The width of the finger electrode 52 in the y axis direction is "γ" where the inter-cell wiring member 18 is not disposed, and the width of the finger electrode 52 in the y axis direction is "β" where the inter-cell wiring member 18 is disposed, where $\gamma > \beta$. In other words, the width of the finger electrode 52 in the second area 72 defined where the inter-cell wiring member 18 is disposed is configured to be smaller than the width defined where the inter-cell wiring member 18 is not disposed.

A C-C' section in the plan view shown at the bottom is shown at the top of FIG. 5B. The bus bar electrode 50 and the finger electrode 52 are disposed on the positive direction side of the photoelectric conversion layer 60 along the z axis. The height of the finger electrode 52 in the z axis direction is "c" where the inter-cell wiring member 18 is not disposed, and the height of the finger electrode 52 in the z axis direction is "b" where the inter-cell wiring member 18 is disposed, where $c > b$. In other words, the height of the finger electrode 52 in the second area 72 defined from the part of the photoelectric conversion layer 60 where the inter-cell wiring member 18 is disposed is smaller than the height from the part of the photoelectric conversion layer 60 where the inter-cell wiring member is not disposed.

Further, the height of the bus bar electrode 50 in the z axis direction is "r", where $r > b$. In other words, the height of the finger electrode 52 in the second area 72 defined from the part of the photoelectric conversion layer 60 where the inter-cell wiring member 18 is disposed is smaller than the height of the bus bar electrode 50 from the photoelectric conversion layer 60. According to the feature, the inter-cell wiring member 18 is primarily connected to the positive direction side of the bus bar electrode 50 along the z axis via the conductive film adhesive. The bus bar electrode 50 and the inter-cell wiring member 18 are bonded, but the finger electrode 52 and the inter-cell wiring member 18 are not bonded. This is a feature to make an adjustment to the bonding strength in the first area 70. As described above, the bus bar electrode 50 and the finger electrode 52 are formed by screen printing on the light receiving surface of the photoelectric conversion layer 60. Therefore, the smaller the width of the finger electrode 52, the smaller the height of the finger electrode 52. The same holds true of the bus bar electrode 50. Further, comparing FIG. 5A and FIG. 5B as to the portion where the inter-cell wiring member 18 is disposed, the height of the finger electrode 52 in the first area 70 is larger than the height of the finger electrode 52 in the second area 72. FIGS. 5A-5B show that the wiring member 18 is disposed at a position where the height of the finger electrode 52 differs from that of the other positions. Alternatively, the inter-cell wiring member 18 may be disposed at a position displaced from the position where the height of the finger electrode 52 differs from that of the other positions.

Further, in the third area 74, the width of the finger electrode 52 in the y axis direction is "γ" where the inter-cell wiring member 18 is not disposed and where the inter-cell wiring member 18 is disposed. In other words, the width of the finger electrode 52 is uniform in the third area 74 regardless of whether the inter-cell wiring member 18 is disposed or not. Meanwhile, in the third area 74, the height of the finger electrode 52 in the z axis direction is "c" where the inter-cell wiring member 18 is not disposed and where the inter-cell wiring member 18 is disposed. In other words, the height of the finger electrode 52 is uniform in the third area 74 regardless of whether the inter-cell wiring member 18 is disposed or not.

Figure 6A:
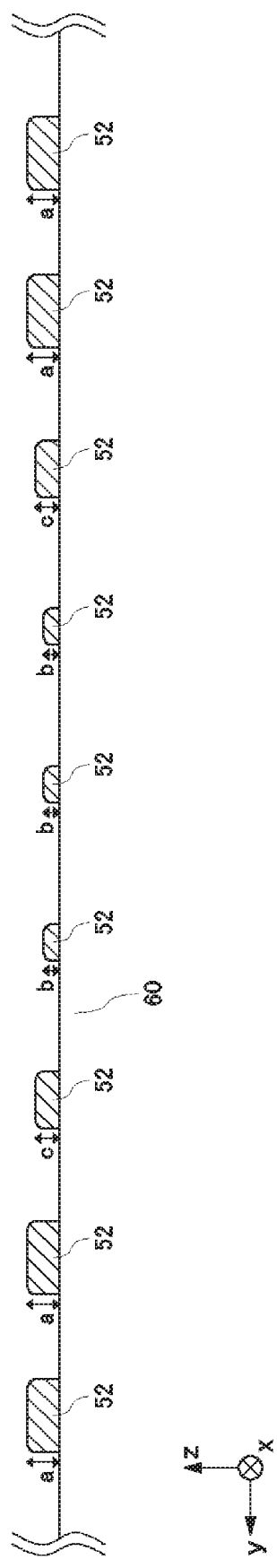
FIGS. 6A-6B are cross sectional views of the finger electrodes of FIG. 3A along the y axis.
Figure 6B:
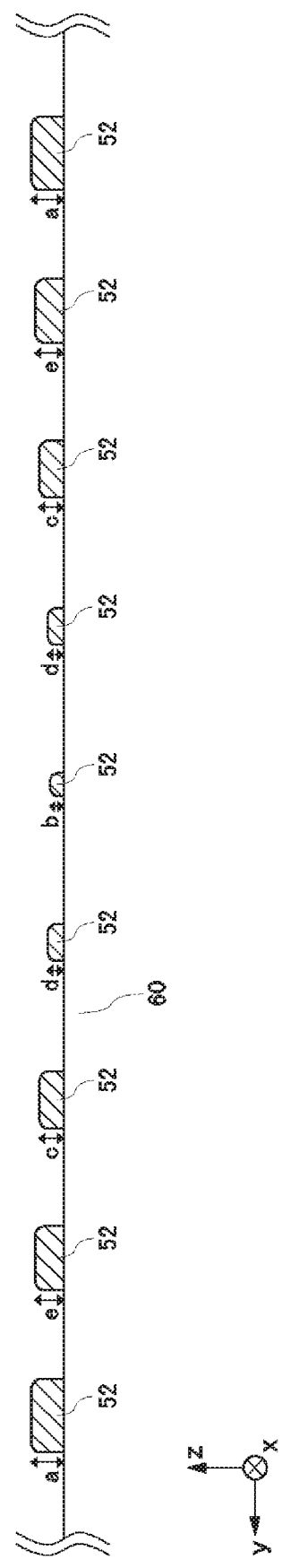

FIGS. 6A-6B are cross sectional views of the finger electrodes 52 along the y axis. FIGS. 6A-6B show E-E' sections of FIG. 3a. As shown in FIG. 6a, the plurality of finger electrodes 52 are arranged and disposed in the y axis direction on the light receiving surface of the photoelectric conversion layer 60. The height of the finger electrode 52 disposed at the extremity in the positive direction along the y axis and that of the adjacent finger electrode 52 are configured to be "a". Further, the height of the finger electrode 52 disposed at the extremity in the negative direction along the y axis and that of the adjacent finger electrode 52 are configured to be "a". In other words, the first area 70 is provided for these four finger electrodes 52.

Further, the height of the three finger electrodes 52, including the finger electrode 52 at the center in the y axis direction, from the photoelectric conversion layer 60 is configured to be "b". In other words, the second area 72 is provided for these three finger electrodes 52. Further, the height of the remaining two finger electrodes 52 from the photoelectric conversion layer 60 is configured to be "c". In other words, the third area 74 is provided for these two finger electrodes 52. In this way, the number of types of heights fewer than the number derived from dividing the number of finger electrodes 52 by two is defined. In other words, the height of the plurality of finger electrodes 52 from the part of the photoelectric conversion layer 60 where the inter-cell wiring member 18 is disposed is configured to be higher in steps from the center toward the end in the y axis direction.

FIG. 6B shows an example different from that of FIG. 6A. FIG. 6B is a figure equivalent to FIG. 6A. As in the aforementioned case, the height of the finger electrode 52 disposed at the extremity in the positive direction along the y axis and that of the finger electrode 52 disposed at the extremity in the negative direction along the y axis, from a photoelectric conversion layer 60 are configured to be "a". Further, the height of the finger electrode 52 at the center in the y axis direction from the photoelectric conversion layer 60 is configured to be "b". Further, the height of the finger electrodes 52 between the finger electrodes 52 at the extremities and the finger electrode 52 at the center from the photoelectric conversion layer 60 is configured to be "c". However, the number of types of heights from the photoelectric conversion layer 60 is limited to "three" in FIG. 6A. Meanwhile, in FIG. 6B, the height from the photoelectric conversion layer 60 is configured to be progressively larger toward the finger electrodes 52 at the extremities in the y axis direction. In other words, the heights of the finger electrodes 52 are configured to be "b", "d", "c", "e", "a", starting from the finger electrode 52 at the center in the y axis direction toward the finger electrode 52 disposed at the extremity in the positive direction along the y axis, where $b<d<c<e<a$.

The features on the light receiving surface of the solar cell 10 have been described above with reference to FIGS. 5A-5C and FIGS. 6A-6b. The back surface of the solar cell 10 may be similarly configured so that a description thereof is omitted. An alternative feature of the finger electrodes 52 will be described below. For example, the finger electrode 52 is configured to be thinner and lower in the part of the second area 72 where the inter-cell wiring member 18 is disposed than in the other parts. For this reason, the cross sectional area of the finger electrode 52 in that part will be smaller than the cross sectional area of the finger electrode 52 in the other parts. The smaller cross sectional area of the finger electrode 52 may increase the electrical resistance and lower the conductivity. A description will now be given of a feature for maintaining the conductivity of the finger electrode 52 even when the finger electrode 52 is configured to be thin and low.

Figure 7A:
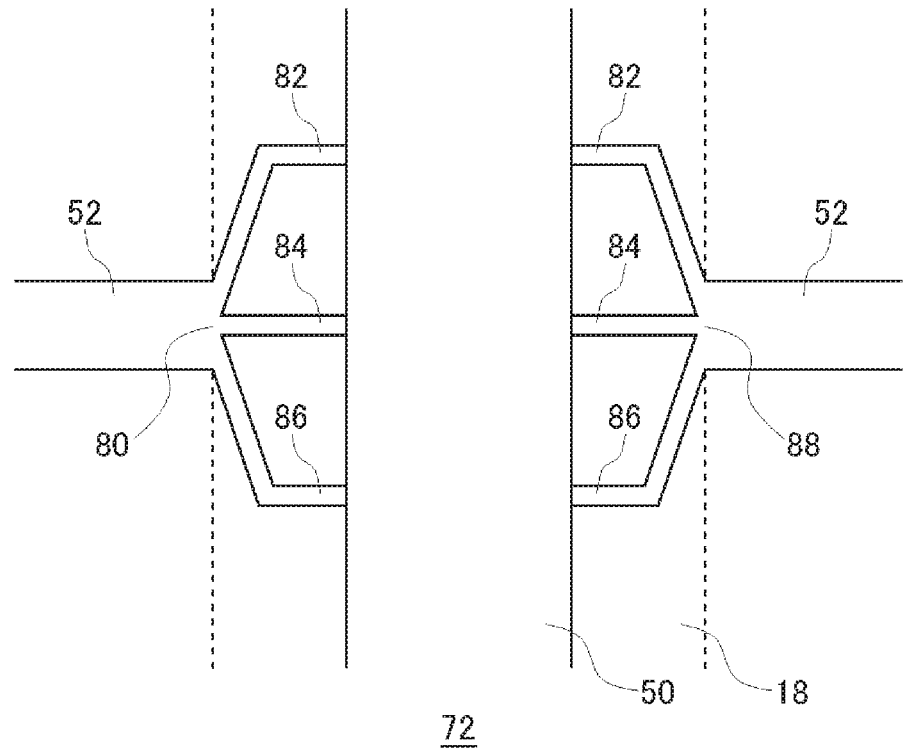
FIGS. 7A-7B are plan view showing the detail of a portion of the finger electrode of FIG. 3A.
Figure 7B:
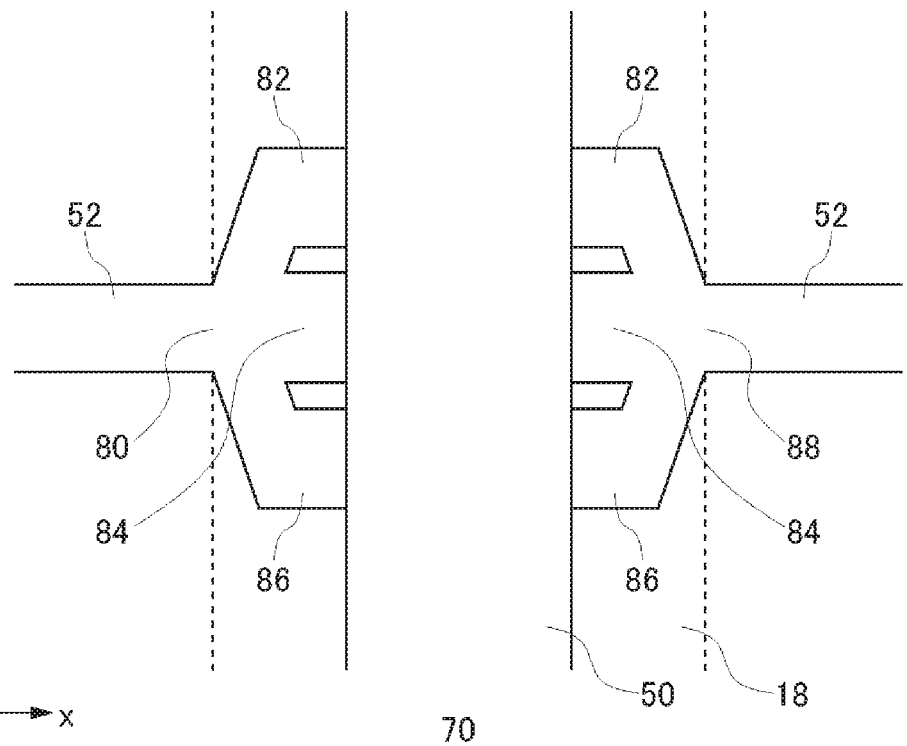

FIGS. 7A-7B are plan view showing the detail a portion of the finger electrode 52. FIG. 7A shows an alternative feature of the finger electrode 52 in the second area 72. The finger electrode 52 extends from the negative direction side toward the positive direction side along the x axis and reaches the part where the inter-cell wiring member 18 is disposed. A branching point 80 is defined in the part reached. At the branching point 80, the finger electrode 52 branches into a first branch electrode 82, a second branch electrode 84, and a third branch electrode 86. The height of each of the first branch electrode 82, the second branch electrode 84, and the third branch electrode 86 is configured to be smaller than the height of the finger electrode 52 as already described. Therefore, the cross sectional area of branch electrodes is configured to be smaller than the cross sectional area of the finger electrode 52. However, the first branch electrode 82, the second branch electrode 84, and the third branch electrode 86 are formed such that the total of the cross sectional areas of the branch electrodes is equal to larger than the cross sectional area of the finger electrode 52. The first branch electrode 82, the second branch electrode 84, and the third branch electrode 86 are connected to the bus bar electrode 50.

Further, the first branch electrode 82, the second branch electrode 84, and the third branch electrode 86 extend in the positive direction along the x axis from the bus bar electrode 50 and meet at a meeting point 88. In other words, the finger electrode 52 branches into a plurality of branches in the part where the inter-cell wiring member 18 is disposed. The branching point 80 and the meeting point 88 are distinguished for convenience of the description. In practice, however, the branching point 80 and the meeting point 88 are configured similarly and may be disposed in an inverted manner. The positive direction side of the meeting point 88 along the x axis is where the inter-cell wiring member 18 is not disposed and where the finger electrode 52 is disposed. The electrical resistance of each of the first branch electrode 82, the second branch electrode 84, and the third branch electrode 86 is larger than the electrical resistance of the finger electrode 52. By arranging the first branch electrode 82, the second branch electrode 84, and the third branch electrode 86, it is ensured that the conductivity is not lowered.

FIG. 7B shows an example in which the feature of FIG. 7A is applied to the first area 70. The finger electrode 52, the branching point 80, the first branch electrode 82, the second branch electrode 84, the third branch electrode 86, and the meeting point 88 are configured as in the case of FIG. 7A. However, the height of each of the first branch electrode 82, the second branch electrode 84, and the third branch electrode 86 is configured to be larger than the height of the finger electrode 52 so that the cross sectional area of each of first branch electrode 82, the second branch electrode 84, and the third branch electrode 86 is configured to be larger than the cross sectional area of the finger electrode 52. The finger electrode 52 is formed by screen printing so that the width of each of the first branch electrode 82, the second branch electrode 84, and the third branch electrode 86 is configured to be larger than that of the finger electrode 52. It should be noted that the finger electrode 52 branches into branches in parts other than the first area 70 and the second area 72 and where the bus bar electrode 50 and the finger electrode 52 intersect.

Referring to FIGS. 7A-7B, the branching point 80 and the meeting point 88 are shielded from view by the inter-cell wiring member 18 when the solar cell 10 is viewed from the positive direction side along the z axis. However, the branching point 80 or the meeting point 88 may protrude from the inter-cell wiring member 18 when the solar cell 10 is viewed from the positive direction side along the z axis. This feature equally provides the advantage of controlling the bonding force in comparison with the case where the branching point 80 and the meeting point 88 are shielded from view by the inter-cell wiring member 18.

Figure 8A:
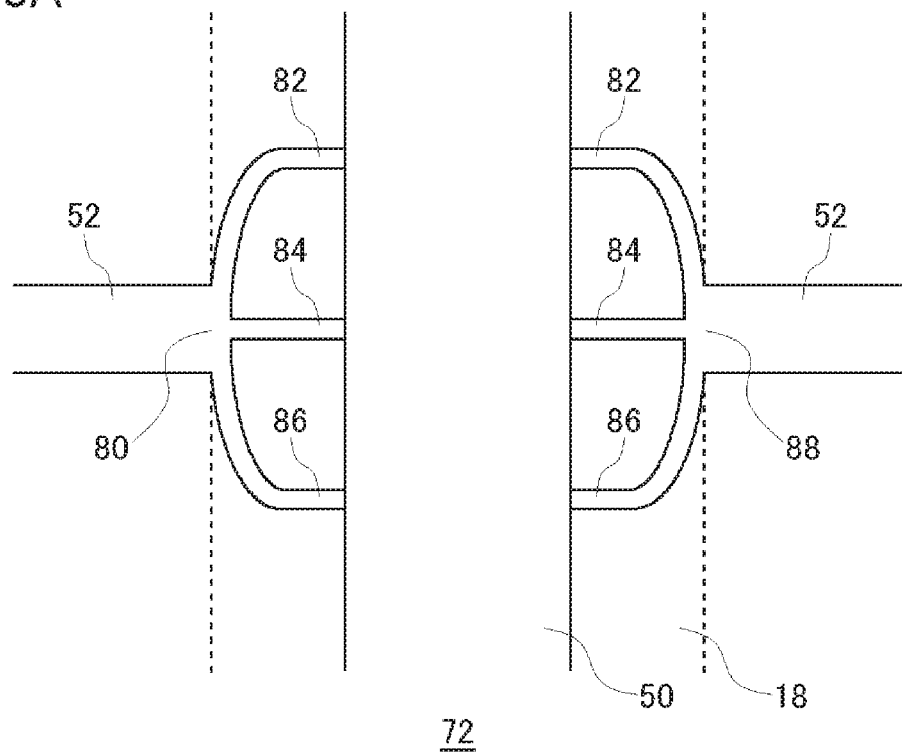
FIGS. 8A-8B are plan views showing an alternative example of a portion of the finger electrode of FIGS. 7A-7B.
Figure 8B:
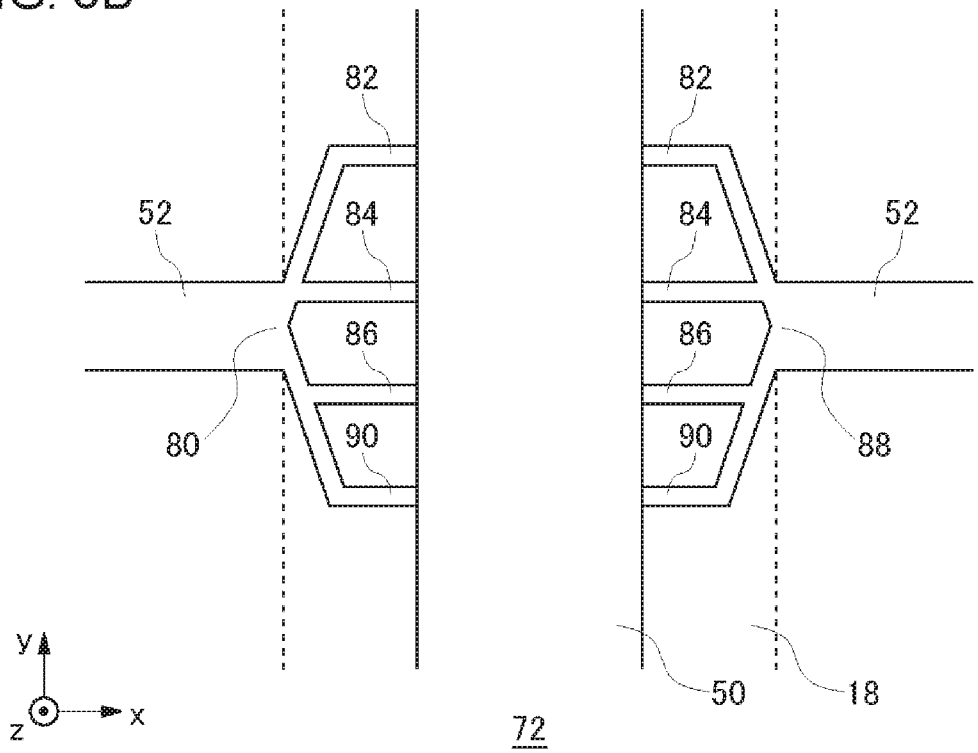

A description will now be given of an alternative feature of the finger electrode 52 that branches into a plurality of branches as in FIGS. 7A-7B. The second area 72 will be discussed here, but the discussion equally applies to the other parts. FIGS. 8A-8B are plan views showing an alternative example of a portion of the finger electrode 52. Referring to FIG. 8A, the finger electrode 52, the branching point 80, the first branch electrode 82, the second branch electrode 84, the third branch electrode 86, and the meeting point 88 are configured as in the case of FIG. 7A. However, the first branch electrode 82 and the third branch electrode 86 include an arc shape and so differ from the branch electrodes described above that are configured as a combination of straight portions. Referring to FIG. 8B, the finger electrode 52 branches the branching point 80 into four branches including the first branch electrode 82, the second branch electrode 84, the third branch electrode 86, and a fourth branch electrode 90, which meet at the meeting point 88. In other words, the number of branches of the finger electrode 52 is not limited to "3".

Figure 9A:
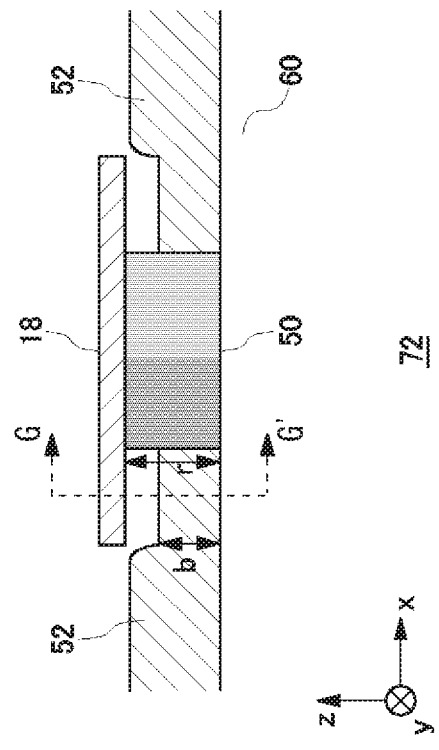
FIGS. 9A-9E show an alternative view of a portion of the solar cell of FIG. 3A.
Figure 9B:
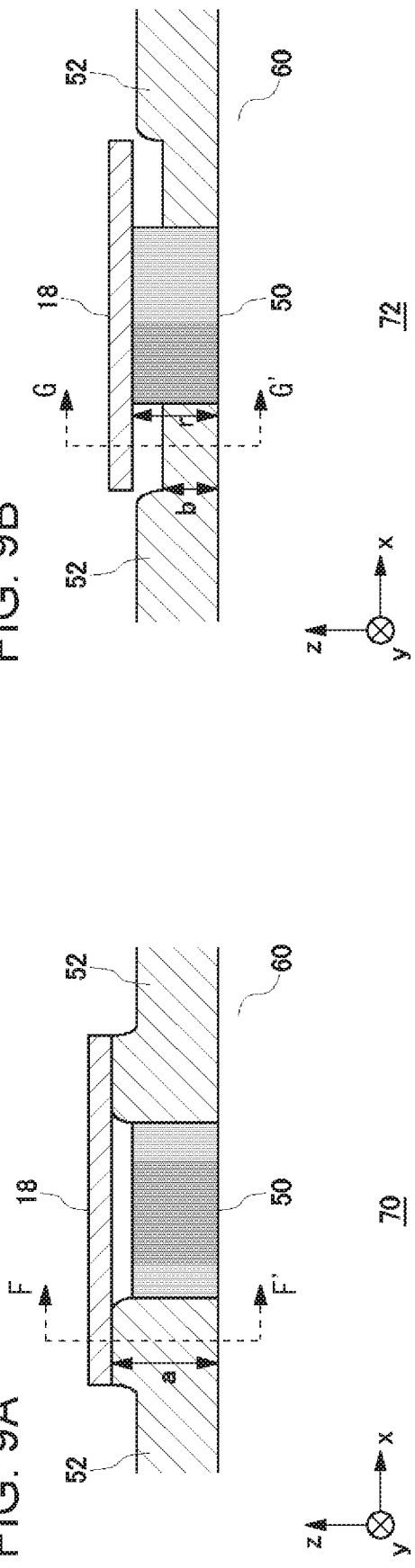

As mentioned above, a conductive film adhesive is used to bond the bus bar electrode 50 or the finger electrode 52 to the inter-cell wiring member 18. A description will be given here of the arrangement of the conductive film adhesive and, in particular, the arrangement of the conductive film adhesive that results after the inter-cell wiring member 18 is subjected to thermal compression bonding. FIGS. 9A-9E show an alternative feature of a portion of the solar cell 10 of FIG. 3A in detail. FIGS. 9A-9B are equivalent to FIGS. 5A-5B. FIGS. 9A-9B show directions of view of the cross sectional views described below.

Figure 9C:
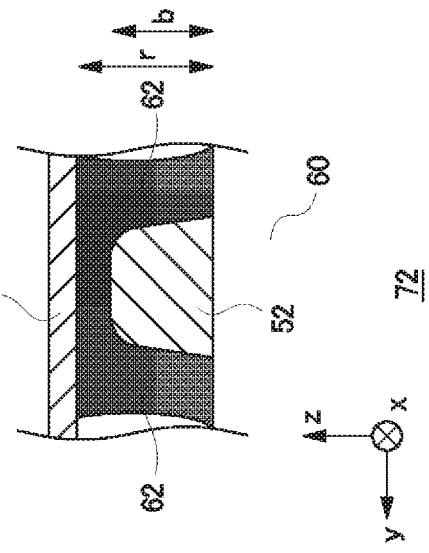
Figure 9D:
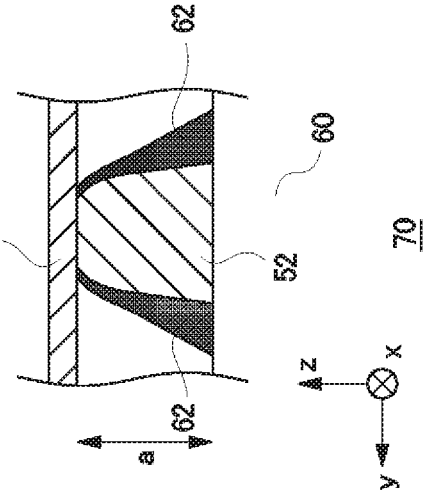

FIGS. 9C-9D are F-F' sections showing the first area 70 of FIG. 9A on an enlarged scale. The inter-cell wiring member 18 is fixed by disposing a conductive film adhesive 62 on the solar cell 10 and disposing the inter-cell wiring member 18 thereon for thermal compression bonding. The conductive film adhesive 62 is temporarily melted by thermal compression bonding, moves in the z axis direction, and is solidified as shown in FIGS. 9C-9D. The arrangement of the conductive film adhesive 62 after thermal compression bonding will be as shown in FIG. 9C or as shown in FIG. 9D depending on the arrangement of the conductive film adhesive 62 before thermal compression bonding. The inter-cell wiring member 18 is supported by the finger electrode 52, and the height of the finger electrode 52 in the z axis direction is configured to be "a", which is relatively high. For this reason, the space sandwiched between the inter-cell wiring member 18 and the photoelectric conversion layer 60 where the finger electrode 52 is not provided will be relatively extensive. This results in a relatively small area of bonding between the inter-cell wiring member 18 or the photoelectric conversion layer 60 and the conductive film adhesive 62.

Figure 9E:
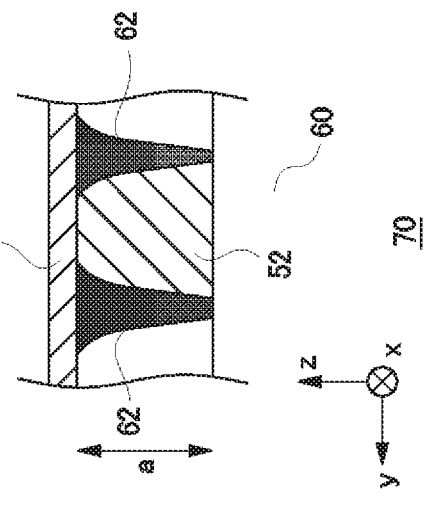

Meanwhile, FIG. 9E shows a G-G' section showing the second area 72 of FIG. 9B on an enlarged scale. The conductive film adhesive 62 is temporarily melted by thermal compression bonding, moves in the z axis direction, and is solidified as shown in FIG. 9E. In this case, the conductive film adhesive 62 is provided between the inter-cell wiring member 18 and the finger electrode 52 as well. Moreover, the height of the inter-cell wiring member 18 from the photoelectric conversion layer 60 is configured to be "r", and the height of the finger electrode 52 in the z axis direction is configured to be "b", which is relatively small. For this reason, the space sandwiched by the inter-cell wiring member 18 and the photoelectric conversion layer 60 where the finger electrode 52 is not provided will be relatively less expansive. This increases the area of bonding between the inter-cell wiring member 18/the photoelectric conversion layer 60 and the conductive film adhesive 62.

Comparing FIGS. 9C-9D with FIG. 9E, the contact area of the conductive film adhesive 62 is smaller in the former than in the latter, i.e., smaller in the first area 70 than in the second area 72. This results in a small bonding force in the first area 70 than in the second area 72.

A description will now be given of a method of manufacturing the solar cell module 100. First, the photoelectric conversion layer 60 is prepared. The solar cell 10 is manufactured by forming the plurality of finger electrodes 52 extending in the x axis direction on the light receiving surface and the back surface of the photoelectric conversion layer 60 and forming the plurality of bus bar electrodes 50 extending in the y axis direction. The shape of the finger electrodes 52 is as already described.

Subsequently, the stack is produced by sequentially layering the first protective member 40a, the first encapsulating member 42a, the solar cell 10, the second encapsulating member 42b, and the second protective member 40b from the positive direction side toward the negative direction side along the z axis. In this process, a conductive film adhesive is drawn from a roll of the conductive film adhesive wound around a reel member and is used to bond the surface of the solar cell 10 and the inter-cell wiring member 18. For bonding, thermal compression bonding is performed.

This is followed by a laminate cure process performed for the stack. In this process, air is drawn from the stack, and the stack is heated and pressurized so as to be integrated. Further, the terminal box 44 is attached to the second protective member 40b using an adhesive.

The method of manufacturing the solar cell 10 in this solar cell module 100 will be described in further detail, highlighting the case where the finger electrode 52 branches into a plurality of branches as in FIG. 7A-7B. The second area 72 will be discussed, but the other parts are manufactured similarly. As mentioned before, the bus bar electrode 50 and the finger electrode 52 are formed by screen printing. In screen printing, a screen plate having an opening commensurate with the pattern of the bus bar electrode 50 and the finger electrode 52 that should be formed is used. By placing silver paste on the screen plate and rubbing the silver paste using a squeegee, the silver paste passes through the opening in the screen plate and is transferred to the photoelectric conversion layer 60.

Figure 10:
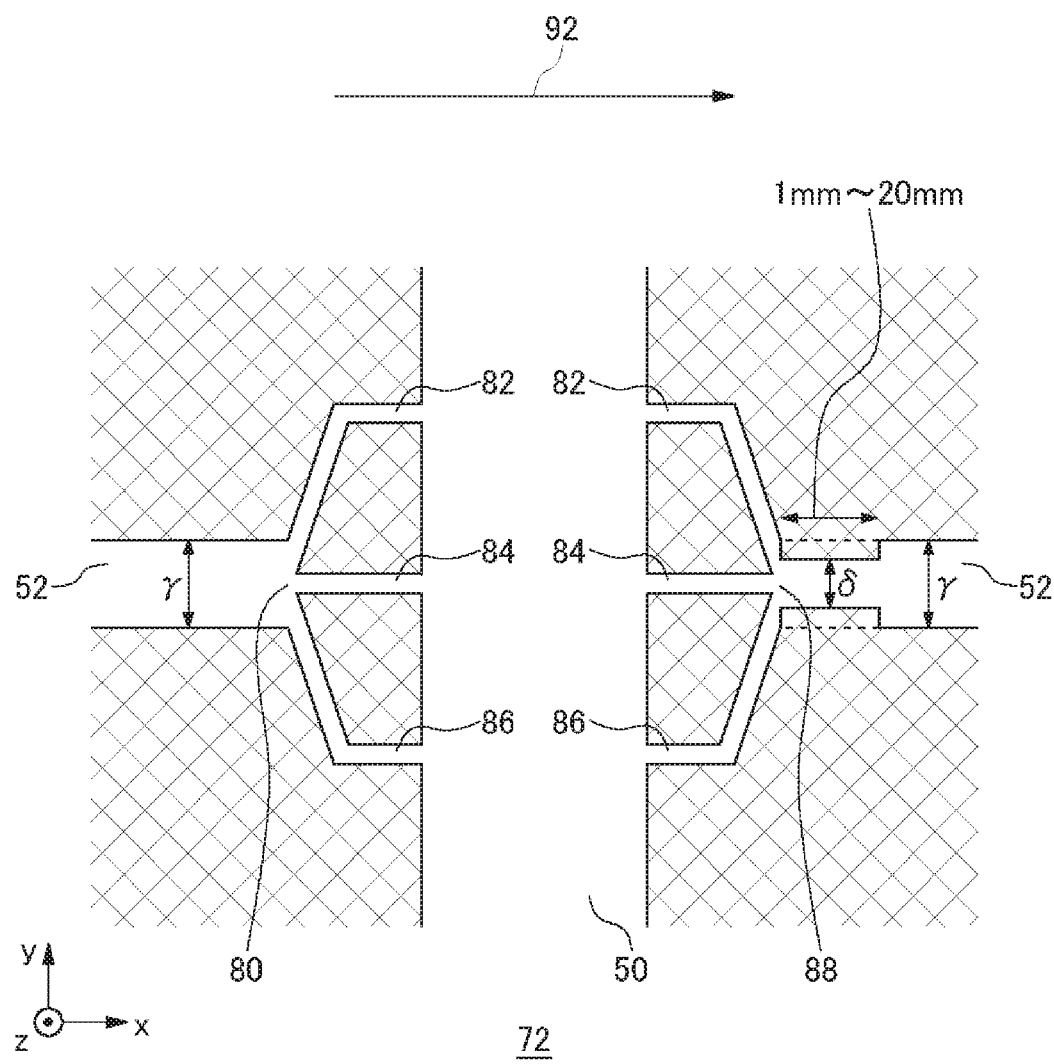
FIG. 10 is a plan view showing a screen plate including the finger electrode of FIG. 7B.

FIG. 10 is a plan view showing a screen plate including the finger electrode 52. FIG. 10 is a figure equivalent to FIG. 7A and shows a printing direction 92 of screen printing. The printing direction 92 is defined to extend from the negative direction side toward the positive direction side along the x axis. In this case, the width of the finger electrode 52 extending toward the branching point 80 is configured to be "γ". Meanwhile, the first branch electrode 82, the second branch electrode 84, and the third branch electrode 86 meet at the meeting point 88 as described above. Therefore, the silver paste from the first branch electrode 82, the second branch electrode 84, and the third branch electrode 86 is collected at the meeting point 88. For this reason, the amount of silver paste at the meeting point 88 tends to be larger than the amount of silver paste at the branching point 80. If the width of the finger electrode 52 extending in the positive direction along the x axis from the meeting point 88 is equally configured to be "γ" near, in particular, the meeting point 88, the height of the finger electrode 52 in this part will be larger than the height of the finger electrode 52 extending toward the branching point 80. To approximate the heights of the finger electrode 52 in these two parts, the width of the finger electrode 52 extending in the positive direction along the x axis from the meeting point 88 is configured to be "δ" over a certain range in the screen plate, where δ<γ. More specifically, it is preferable that the width of the opening in the screen plate for screen printing is smaller over a range of 1 mm~20 mm (e.g., about 5 mm) beyond the meeting point of the finger electrode 52 than the pre-branching width.

According to this embodiment, the height of the finger electrode 52 toward the end in the direction of extension of the inter-cell wiring member 18 defined where the inter-cell wiring member 18 is adapted to be disposed is larger than the height of the finger electrode 52 at the center in that direction defined in the equivalent part. Therefore, the area of contact between the bus bar electrode 50 and the inter-cell wiring member 18 is reduced. Since the area of contact between the bus bar electrode 50 and the inter-cell wiring member 18 is reduced, the connection between the solar cell 10 and the inter-cell wiring member 18 is weakened. Since the connection between the solar cell 10 and the inter-cell wiring member 18 is weakened, the stress exerted on the solar cell 10 is reduced. Since the stress exerted on the solar cell 10 is reduced, the durability of the solar cell 10 is improved. Since the durability of the solar cell 10 is improved, the durability of the solar cell module 100 is also improved.

The height of the finger electrode 52 may be configured to vary progressively from the center toward the end in the direction of extension of the inter-cell wiring member 18, or the height of the finger electrode 52 near the end may be distinctively large. Where the finger electrodes 52 are categorized into several groups and the height is configured to vary in steps from one group to another, the height of the finger electrode 52 is limited to several types so that it is easier to design and manufacture the solar cell 10. Since the height differs depending on the position of the finger electrode 52, the bonding force between the solar cell 10 and the inter-cell wiring member 18 can be adjusted in a refined manner. Further, the height of the finger electrode 52 toward the end in the direction of extension of the inter-cell wiring member 18 defined in a part where the inter-cell wiring member 18 is adapted to be disposed is larger than the height in the other parts. Therefore, the height elsewhere is ensured to be relatively smaller. Since the height the other parts is ensured to be smaller, the width of the finger electrode 52 in the other parts is ensured to be smaller. Since the width of the finger electrode 52 is reduced, the photoelectric conversion efficiency is improved.

Further, even when the finger electrode 52 is formed to have a relatively small height and a relatively small width, the conductivity equivalent to that of the parts other than the second area 72 can be secured in the second area 72 by causing the finger electrode 52 to branch into a plurality of branches in a part where the inter-cell wiring member 18 is adapted to be disposed. Further, branching of the finger electrode 52 into a plurality of branches in a part where the inter-cell wiring member 18 is adapted to be disposed provides the sufficient benefit of weakening the bonding force between the inter-cell wiring member 18 and the finger electrode 52 in the first area 70. Further, the height of the bus bar electrode 50 is smaller than the height of the finger electrode 52 toward the end in the direction of extension of the inter-cell wiring member 18 defined where the inter-cell wiring member 18 is adapted to be disposed. Therefore, the area of contact between the bus bar electrode 50 and the inter-cell wiring member 18 is reduced. Further, the height of the bus bar electrode 50 is larger than the height of the finger electrode 52 at the center in the direction of extension of the inter-cell wiring member 18 defined where the inter-cell wiring member 18 is adapted to be disposed. Therefore, the bonding strength is adjusted. Further, the width of the opening formed in the screen plate used for screen printing is configured to be smaller beyond the meeting point of the finger electrode 52 than the pre-branching width. Therefore, the width of the finger electrode 52 printed is ensured to be uniform.

A summary of the embodiment is given below. A solar cell 10 according to an embodiment of the present disclosure includes a photoelectric conversion layer 60, and a plurality of finger electrodes 52 disposed on a surface of the photoelectric conversion layer 60 and extending in a first direction. The plurality of finger electrodes 52 are arranged in a second direction in which an inter-cell wiring member 18 adapted to be disposed on the surface of the photoelectric conversion layer 60 extends, the second direction intersecting the first direction, and, a height of each of those of the plurality of finger electrodes 52 disposed toward ends in the second direction from a part of the photoelectric conversion layer 60 where the inter-cell wiring member 18 is adapted to be disposed is larger than a height of the finger electrode 52 disposed at a center in the second direction from the part of the photoelectric conversion layer 60 where the inter-cell wiring member 18 is adapted to be disposed.

The nearer the inter-cell wiring member 18 toward an end in the second direction, the larger the height of at least one of the plurality of finger electrodes 52 from the part of the photoelectric conversion layer 60 where the inter-cell wiring member 18 is adapted to be disposed.

The height of at least one of the plurality of finger electrodes 52 from the part of the photoelectric conversion layer 60 where the inter-cell wiring member 18 is adapted to be disposed may grow higher in steps from the center toward the ends in the second direction.

Of the plurality of finger electrodes 52, (1) the height of the finger electrodes 52 disposed toward the ends in the second direction from the part of the photoelectric conversion layer 60 where the inter-cell wiring member 18 is adapted to be disposed is larger than a height from parts of the photoelectric conversion layer 60 other than the part where the inter-cell wiring member 18 is adapted to be disposed, and (2) the height of the finger electrode 52 disposed at the center in the second direction from the part of the photoelectric conversion layer 60 where the inter-cell wiring member 18 is adapted to be disposed is smaller than a height from parts other than the part where the inter-cell wiring member 18 is adapted to be disposed.

Each of the plurality of finger electrodes 52 may branch into a plurality of branches where the inter-cell wiring member 18 is adapted to be disposed.

The solar cell may further include a bus bar electrode 50 disposed between the surface of the photoelectric conversion layer 60 and the inter-cell wiring member 18 and extending in the second direction. A height of the bus bar electrode 50 from the photoelectric conversion layer 60 is (1) smaller than the height of the finger electrodes 52 disposed toward the ends in the second direction from the part of the photoelectric conversion layer 60 where the inter-cell wiring member 18 is adapted to be disposed, and (2) larger than the height of the finger electrode 52 disposed at the center in the second direction from the part of the photoelectric conversion layer 60 where the inter-cell wiring member 18 is adapted to be disposed.

Another embodiment of the present disclosure related to a solar cell module 100. The solar cell module 100 includes: a plurality of solar cells 10; and an inter-cell wiring member 18 that connects adjacent solar cells 10 electrically, wherein each of the solar cells 10 includes: a photoelectric conversion layer 60; and a plurality of finger electrodes 52 disposed on a surface of the photoelectric conversion layer 60 and extending in a first direction. The plurality of finger electrodes 52 are arranged in a second direction in which the inter-cell wiring member 18 disposed on the surface of the photoelectric conversion layer 60 extends, the second direction intersecting the first direction, and a height of each of those of the plurality of finger electrodes 52 disposed toward ends in the second direction from a part of the photoelectric conversion layer 60 where the inter-cell wiring member 18 is disposed is larger than a height of the finger electrode 52 disposed at a center in the second direction from the part of the photoelectric conversion layer 60 where the inter-cell wiring member 18 is disposed.

Still another embodiment of the present disclosure relates to a method of manufacturing the solar cell 10. The method includes: preparing a photoelectric conversion layer 60; and forming a plurality of finger electrodes 52 extending in a first direction on a surface of the photoelectric conversion layer 60. The plurality of finger electrodes 52 are arranged in a second direction in which an inter-cell wiring member 18 adapted to be disposed on the surface of the photoelectric conversion layer 60 extends, the second direction intersecting the first direction, and, a height of each of those of the plurality of finger electrodes 52 disposed toward ends in the second direction from a part of the photoelectric conversion layer 60 where the inter-cell wiring member 18 is adapted to be disposed is larger than a height of the finger electrode 52 disposed at a center in the second direction from the part of the photoelectric conversion layer 60 where the inter-cell wiring member 18 is adapted to be disposed.

The forming includes causing each of the plurality of finger electrodes 52 to branch into a plurality of branches where the inter-cell wiring member 18 is adapted to be disposed.

The forming includes performing screen printing from one end toward the other in the first direction, and a pre-branching width of each finger electrode 52 in a screen plate for screen printing is configured to be larger than a width beyond a meeting point.

Embodiment 2

A description will now be given of embodiment 2. Like embodiment 1, embodiment 2 relates to a solar cell module in which a plurality of solar cells are disposed. On the light receiving surface and the back surface of the solar cell in embodiment 1, finger electrodes and bus bar electrodes are disposed, and inter-cell wiring members are disposed and layered upon the bus bar electrodes. Meanwhile, bus bar electrodes are not disposed but finger electrodes are disposed on the light receiving surface and the back surface of the solar cell according to embodiment 2. The stress that the solar cell undergoes will be equally large in this solar cell toward the end of the solar cell in the direction of extension of the inter-cell wiring member. A weak connection between the solar cell and the inter-cell wiring member is useful to reduce the stress that the solar cell undergoes. The solar cell module according to embodiment 2 is of the same type as that of FIGS. 1, 2, and 4. The solar cell 10 according to embodiment 2 is configured such that the bus bar electrodes 50 are omitted from the cell shown in FIGS. 3A-3B. The following description highlights the difference.

Figure 11A:
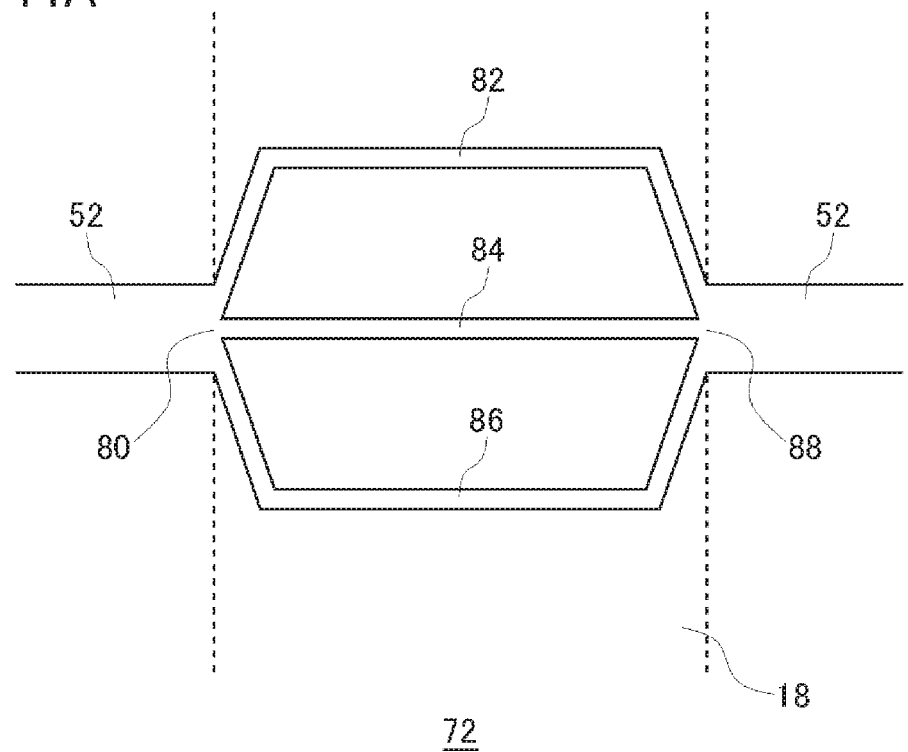
FIGS. 11A-11B are plan views showing the detail of a portion of the finger electrode according to embodiment 2.
Figure 11B:
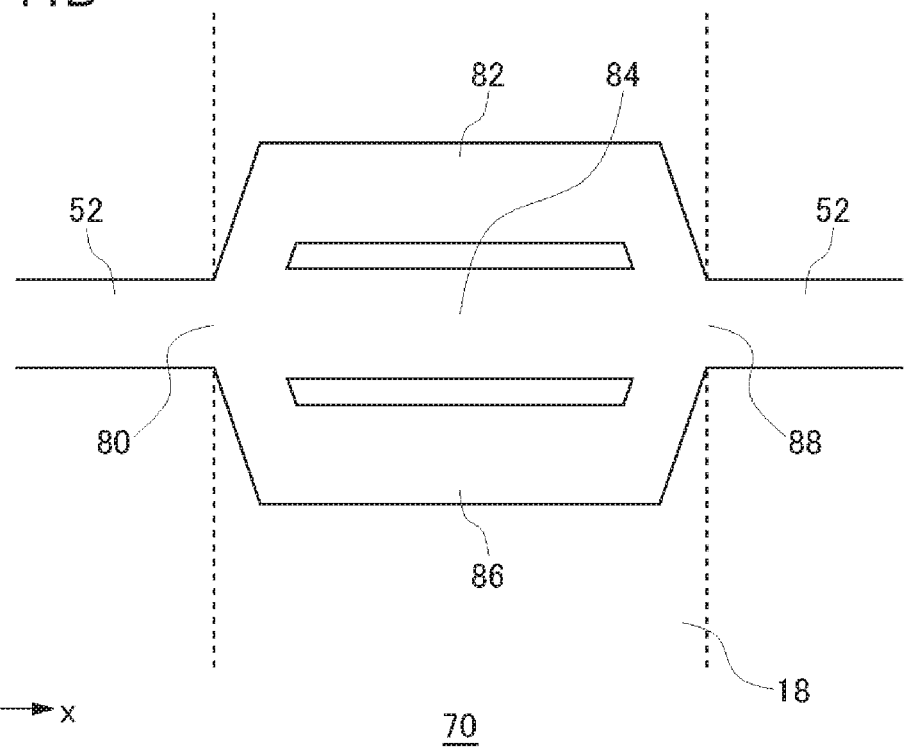

FIGS. 11A-11B are plan views showing the detail of a portion of the finger electrode 52. FIG. 11A shows a feature of the finger electrode 52 in the second area 72. The bus bar electrode 50 is omitted, but the figure is equivalent to FIG. 7A. FIG. 11B shows a feature of the finger electrode 52 in the first area 70. The bus bar electrode 50 is omitted here as well, but the figure is equivalent to FIG. 7B. The finger electrode 52 is similarly configured in the parts other than the second area 72 and where the bus bar electrode 50 and the finger electrode 52 intersect.

According to this embodiment, the stress is equally reduced in the solar cell 10 in which the bus bar electrodes 50 are not disposed and only the finger electrodes 52 are disposed. Since the finger electrode 52 branches into a plurality of branches, it is easy to place the finger electrode 52 and a measuring terminal of a measuring instrument in contact each other in the absence of the bus bar electrode 50 during the step of measuring an output in the solar cell 10 manufacturing process. Therefore, it is easy to test the solar cell 10.

Embodiment 3

A description will now be given of embodiment 3. Like the foregoing embodiments, embodiment 3 relates to a solar cell module in which a plurality of solar cells are disposed. In the foregoing embodiments, the height of the finger electrode is configured to be larger toward both ends than at the center of the solar cell in the direction of extension of the inter-cell wiring member. This is because of a larger stress that the solar cell undergoes toward the ends. Meanwhile, the inter-cell wiring member connects two adjacent solar cells electrically. Therefore, of the ends in the direction of extension of the inter-cell wiring member, the stress at the end nearer the adjacent solar cell is larger than the stress toward the remote end. In embodiment 3, the height of the finger electrode is configured to be larger toward the end nearer the adjacent solar cell than at the center of the solar cell in the direction of extension of the inter-cell wiring member. The solar cell module 100 according to embodiment 3 is of the same type as that of FIGS. 1, 2, and 4. The following description highlights the difference.

Figure 12A:
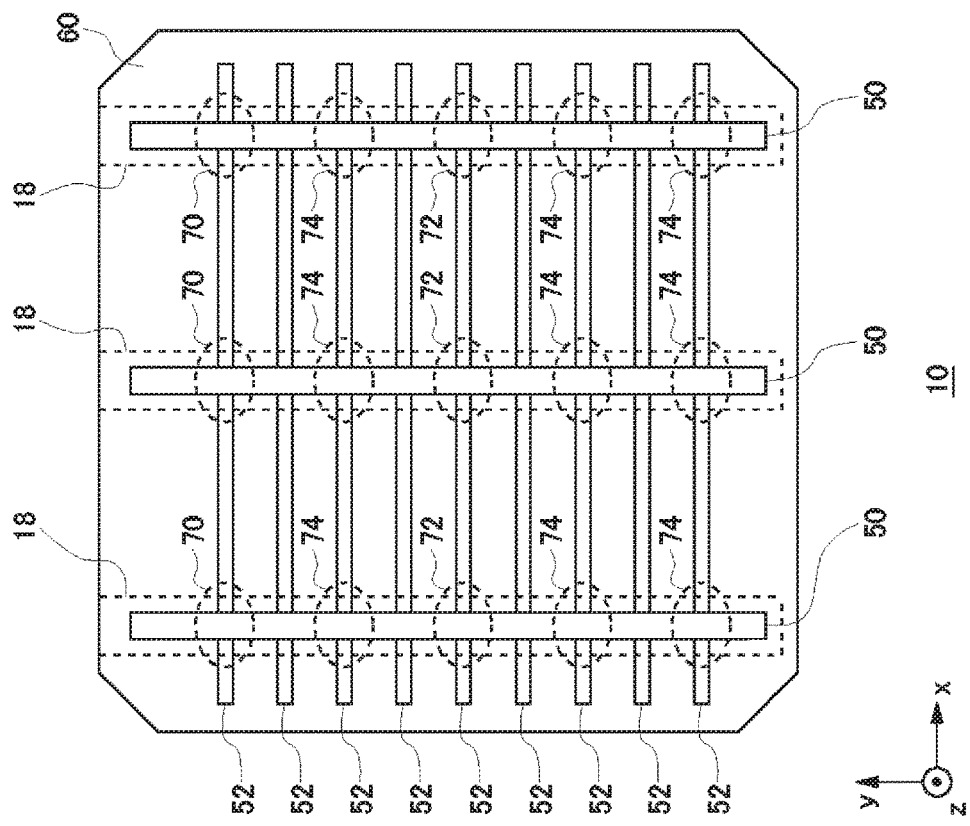
FIGS. 12A-12B are plan views showing the feature of the solar cell according to embodiment 3.
Figure 12B:
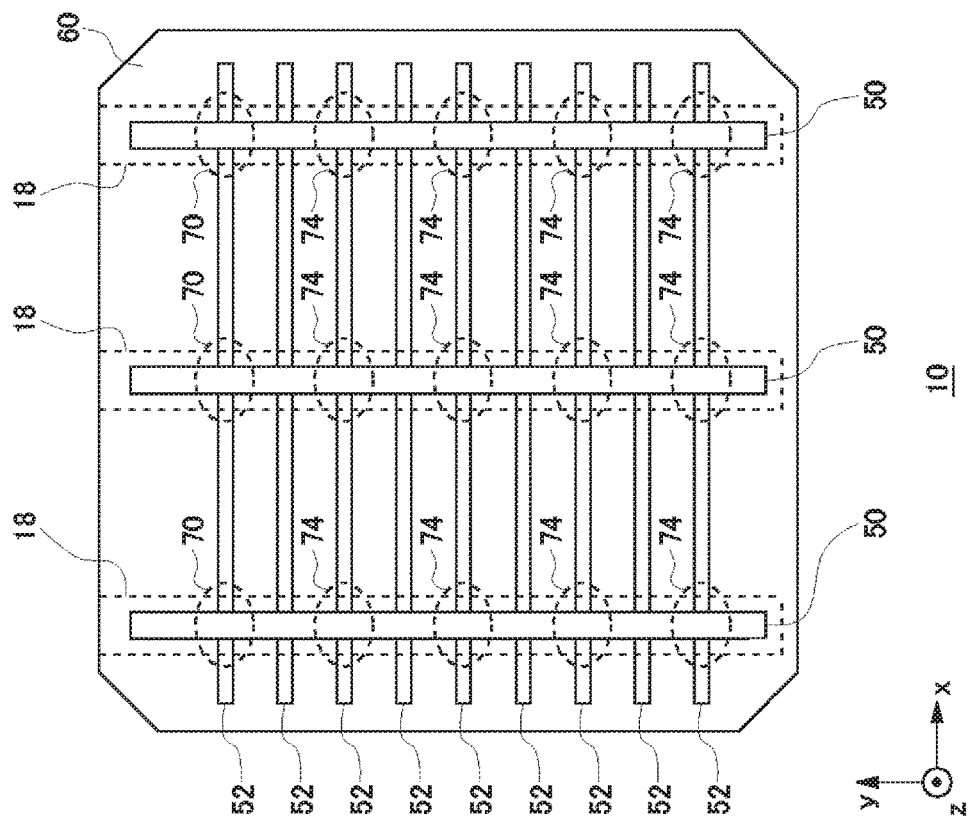

FIGS. 12A-12B are plan views showing the feature of the solar cell 10 according to embodiment 3. Like FIG. 3A, these figures show the light receiving surface of the solar cell 10. As mentioned above, the inter-cell wiring member 18 extends in the y axis direction. In particular, the inter-cell wiring member 18 extends beyond the solar cell 10 toward the positive direction side along the y axis where another adjacent solar cell 10 (not shown) is disposed. Referring to FIG. 12A, the first area 70 is provided around a portion of one of the plurality of finger electrodes 52 disposed toward an end in the positive direction along the y axis, where the inter-cell wiring member 18 is disposed. For example, three first areas 70 are provided for the finger electrode 52 disposed at the extremity in the positive direction along the y axis. Meanwhile, the third area 74 is provided around a portion of each of those of the plurality of finger electrodes 52 other than the finger electrodes 52 for which the first area 70 is provided, where the inter-cell wiring member 18 is disposed. Therefore, the third area 74 is provided around a portion of one of the plurality of finger electrodes 52 disposed toward an end in the negative direction along the y axis, where the inter-cell wiring member 18 is disposed. The height of the finger electrodes 52 in the first area 70 and in the third area 74 is as already described so that a description thereof is omitted.

FIG. 12B shows a pattern different from that of FIG. 12A. The arrangement of the first areas 70 in FIG. 12B is identical to that of FIG. 12A. Meanwhile, referring to FIG. 12B, the second area 72 is provided around a portion of one of the plurality of finger electrodes 52 disposed at the center in the y axis direction, where the inter-cell wiring member 18 is provided. For example, three second areas 72 are provided for the finger electrode 52 disposed at the center in the y axis direction. The height of the finger electrodes 52 in the second area 72 is as already described so that a description thereof is omitted. Further, the back surface of the solar cell 10 may be configured similarly so that a description thereof is omitted.

According to this embodiment, the height of the finger electrode 52 disposed toward one end in the direction of extension of the inter-cell wiring member 18 from the photoelectric conversion layer 60 is configured to be larger than that of the finger electrode 52 disposed at the center. Therefore, the stress exerted on the solar cell 10 toward the one end is reduced. Further, since the height of the finger electrodes 52 disposed toward one end from the photoelectric conversion layer 60 is configured to be larger, the number of finger electrodes 52 for which the height is increased is reduced. Since the number of finger electrodes 52 for which the height is increased is reduced, the volume of silver paste used is reduced. Since the height of the finger electrode 52 disposed toward the end nearer the adjacent solar cell 10 is configured to be larger than the height of the finger electrode 52 disposed at the center, the stress exerted on the solar cell 10 toward the end nearer the adjacent solar cell 10 is reduced.

A summary of the embodiment is given below. A height of one of the plurality of finger electrodes 52 disposed toward one end in the second direction from a part of the photoelectric conversion layer 60 where the inter-cell wiring member 18 is adapted to be disposed may be larger than a height of the finger electrode 52 disposed at a center in the second direction from the part of the photoelectric conversion layer 60 where the inter-cell wiring member 18 is adapted to be disposed.

The inter-cell wiring member 18 may connect the solar cell 10 and another solar cell 10 adjacent to the solar cell 10 electrically, and the finger electrode 52 disposed toward the one end in the second direction may be the finger electrode 52 disposed toward an end nearer the other solar cell 10.

Described above is an example of this embodiment in which the bus bar electrodes are provided as in FIG. 3. Alternatively, this embodiment may be applied to a solar cell not provided with bus bar electrodes as in the case of FIG. 11. More specifically, even in the absence of bus bar electrodes, three areas where the height of the finger electrode 52 is larger may be provided for the finger electrode 52 disposed at the extremity in the positive direction along the y axis.

When the inter-cell wiring member 18 is bonded to the finger electrode 52 in the absence of the bus bar electrodes 50 in the solar cell 10, the extent in which the inter-cell wiring member 18 and the top surface of the finger electrode 52 are directly in contact with each other without mediated by the conductive film adhesive 62 will be increased accordingly. In this case, the conductive film adhesive 62 moves in the z axis direction when heated and melted. The extent that the conductive film adhesive 62 spreads in the y axis direction is greatly affected by the distance between the surface of the solar cell 10 and the inter-cell wiring member 18. In other words, the area over which the conductive film adhesive 62 spreads in the second area 72, where the height of the finger electrode 52 is smaller, will be larger than the area over which the conductive film adhesive 62 spreads in the first area 70, where the height of the finger electrode 52 is larger. It is therefore ensured that the bonding force is smaller in the first area 70 than in the second area 72.

Described above is an explanation based on an exemplary embodiment. The embodiment is intended to be illustrative only and it will be understood by those skilled in the art that various modifications to constituting elements and processes could be developed and that such modifications are also within the scope of the present disclosure.

In embodiments 1 through 3, the finger electrodes 52 are formed by screen printing, and the larger the width of the finger electrode 52, the larger the height of the finger electrode 52. In other words, the height of the finger electrode 52 is regulated by regulating the width of the finger electrode 52. Alternatively, however, the height of the finger electrode 52 may be regulated without regulating the width of the finger electrode 52, by performing screen printing multiple times. In this process, the same screen plate may be used multiple times, or different screen plates may be used depending on the number of times of printing.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell comprising:
a photoelectric conversion layer; and
a first finger electrode, a second finger electrode, and a third finger electrode disposed between the first and second finger electrodes, the first, second, and third finger electrodes disposed on a surface of the photoelectric conversion layer, the first finger electrode, the second finger electrode, and the third finger electrode (1) each extending in a first direction and (2) arranged in a second direction, the first direction and the second direction intersecting with each other, wherein
a first wiring member and a second wiring member each extending in the second direction are disposed on the surface of the photoelectric conversion layer, the first wiring member and the second wiring member being arranged in the first direction,
the first finger electrode, the second finger electrode, and the third finger electrode each have a length connecting to both the first wiring member and the second wiring member in the first direction,
the first finger electrode is disposed closer to an edge of the photoelectric conversion layer than the second and third finger electrodes in the second direction,
the solar cell has a first area where the first finger electrode crosses the first wiring member disposed on the surface of the photoelectric conversion layer, a second area where the second finger electrode crosses the first wiring member disposed on the surface of the photoelectric conversion layer, and a third area where the third finger electrode crosses the first wiring member disposed on the surface of the photoelectric conversion layer
a height of the first finger electrode from the surface of the photoelectric conversion layer in the first area is greater than a height of the second finger electrode from the surface of the photoelectric conversion layer in the second area
a height of the third finger electrode from the surface of the photoelectric conversion layer in the third area is less than the height of the first finger electrode from the surface of the photoelectric conversion layer in the first area, and
the height of the third finger electrode from the surface of the photoelectric conversion layer in the third area is greater than the height of the second finger electrode from the surface of the photoelectric conversion layer in the second area.

2. The solar cell according to claim 1, wherein
the height of the first finger electrode from the surface of the photoelectric conversion layer in the first area is greater than a height of the first finger electrode from the surface of the photoelectric conversion layer outside the first area, and
the height of the second finger electrode from the photoelectric conversion layer in the second area is smaller than a height of the second finger electrode from the surface of the photoelectric conversion layer outside the second area.

3. The solar cell according to claim 1, wherein
the first finger electrode branches into a plurality of branches in the first area, and
the second finger electrode branches into a plurality of branches in the second area.

4. The solar cell according to claim 1, further comprising a bus bar collecting electrode disposed between the surface of the photoelectric conversion layer and the first wiring member, the bus bar collecting electrode extending in the second direction, wherein
a height of the bus bar collecting electrode is (1) less than the height of the first finger electrode from the surface of the photoelectric conversion layer in the first area, and (2) greater than the height of the second finger electrode from the surface of the photoelectric conversion layer in the second area.

5. A solar cell module comprising:
a plurality of solar cells; and
a first wiring member and a second wiring member that connect adjacent solar cells electrically, wherein
each of the solar cells includes:
a photoelectric conversion layer; and
a first finger electrode, a second finger electrode, and a third finger electrode disposed between the first and second finger electrodes, the first, second, and third finger electrodes disposed on a surface of the photoelectric conversion layer, the first finger electrode, the second finger electrode, and the third finger electrode (1) each extending in a first direction and (2) arranged in a second direction, the first direction and the second direction intersecting with each other, wherein
the first wiring member and the second wiring member (1) each extend in the second direction are disposed on the surface of the photoelectric conversion layer and (2) are arranged in the first direction,
the first finger electrode, the second finger electrode, and the third finger electrode each have a length connecting to both the first wiring member and the second wiring member in the first direction,
the first finger electrode is disposed closer to an edge of the photoelectric conversion layer than the second and third finger electrodes in the second direction,
the solar cell has a first area where the first finger electrode crosses the first wiring member disposed on the surface of the photoelectric conversion layer, and a second area where the second finger electrode crosses the first wiring member disposed on the surface of the photoelectric conversion layer, and a third area where the third finger electrode crosses the first wiring member disposed on the surface of the photoelectric conversion layer
a height of the first finger electrode from the surface of the photoelectric conversion layer in the first area is greater than a height of the second finger electrode from the surface the photoelectric conversion layer in the second area
a height of the third finger electrode from the surface of the photoelectric conversion layer in the third area is less than the height of the first finger electrode from the surface of the photoelectric conversion layer in the first area, and the height of the third finger electrode from the surface of the photoelectric conversion layer in the third area is greater than the height of the second finger electrode from the surface of the photoelectric conversion layer in the second area.

6. A method of manufacturing a solar cell, comprising:
preparing a photoelectric conversion layer; and
forming a first finger electrode a second finger electrode, and a third finger electrode disposed between the first and second finger electrodes, the first, second, and third finger electrodes on a surface of the photoelectric conversion layer, the first finger electrode, the second finger electrode, and the third finger electrode (1) each extending in a first direction, and (2) arranged in a second direction, the first direction and the second direction intersecting with each other, wherein a first wiring member and a second wiring member each extending in the second direction are disposed on the surface of the photoelectric conversion layer, the first wiring member and the second wiring member being arranged in the first direction, the first finger electrode, the second finger electrode, and the third finger electrode each have a length connecting to both the first wiring member and the second wiring member in the first direction, the first finger electrode is disposed closer to an edge of the photoelectric conversion layer than the second and third finger electrodes in the second direction, the solar cell has a first area where the first finger electrode crosses the first wiring member disposed on the surface of the photoelectric conversion layer, a second area where the second finger electrode crosses the first wiring member disposed on the surface of the photoelectric conversion layer, and a third area where the third finger electrode crosses the first wiring member disposed on the surface of the photoelectric conversion layer a height of the first finger electrode from the surface of the photoelectric conversion layer in the first area is greater than a height of the second finger electrode from the surface of the photoelectric conversion layer in the second area a height of the third finger electrode from the surface of the photoelectric conversion layer in the third area is less than the height of the first finger electrode from the surface of the photoelectric conversion layer in the first area, and the height of the third finger electrode from the surface of the photoelectric conversion layer in the third area is greater than the height of the second finger electrode from the surface of the photoelectric conversion layer in the second area.

7. The method of manufacturing a solar cell according to claim 6, wherein the forming includes causing the first finger electrode to branch into a plurality of branches in the first area and causing the second finger electrode to branch into a plurality of branches in the second area.

8. The method of manufacturing a solar cell according to claim 7, wherein the forming includes performing screen printing from one end toward the other in the first direction, and a pre-branching width of the first finger electrode and the second finger electrode in a screen plate for screen printing is configured to be larger than a width beyond a meeting point.

* * * * *